United States Patent
Kurihara et al.

(10) Patent No.: US 11,936,392 B2
(45) Date of Patent: Mar. 19, 2024

(54) PHASE LOCKED LOOP, ELECTRONIC DEVICE, AND METHOD FOR CONTROLLING PHASE LOCKED LOOP

(71) Applicant: SONY SEMICONDUCTOR SOLUTIONS CORPORATION, Kanagawa (JP)

(72) Inventors: Tsutomu Kurihara, Kanagawa (JP); Tetsuya Fujiwara, Kanagawa (JP)

(73) Assignee: SONY SEMICONDUCTOR SOLUTIONS CORPORATION, Kanagawa (JP)

( * ) Notice: Subject to any disclaimer, the term of this patent is extended or adjusted under 35 U.S.C. 154(b) by 87 days.

(21) Appl. No.: 17/595,922

(22) PCT Filed: Mar. 9, 2020

(86) PCT No.: PCT/JP2020/009912
§ 371 (c)(1),
(2) Date: Nov. 29, 2021

(87) PCT Pub. No.: WO2020/246092
PCT Pub. Date: Dec. 10, 2020

(65) Prior Publication Data
US 2022/0231694 A1    Jul. 21, 2022

(30) Foreign Application Priority Data
Jun. 6, 2019  (JP) .................. 2019-106423

(51) Int. Cl.
*H03L 7/099* (2006.01)
*H03K 3/03* (2006.01)

(52) U.S. Cl.
CPC ............ *H03L 7/0992* (2013.01); *H03K 3/03* (2013.01); *H03L 7/0994* (2013.01); *H03L 2207/50* (2013.01)

(58) Field of Classification Search
CPC ....................................... H03L 7/0992
(Continued)

(56) References Cited

U.S. PATENT DOCUMENTS 10,419,004 B2 *  9/2019  Lim ..................... H03K 23/542
11,585,854 B1 *  2/2023  Cheng .............. H03K 19/00369
(Continued)

FOREIGN PATENT DOCUMENTS

| JP | 2010-199810 A | 9/2010 |
| JP | 2010-273187 A | 12/2010 |

(Continued)

OTHER PUBLICATIONS

International Search Report and Written Opinion of PCT Application No. PCT/JP2020/009912, dated Jun. 9, 2020, 08 pages of ISRWO.

*Primary Examiner* — Lihong Yu
(74) *Attorney, Agent, or Firm* — CHIP LAW GROUP

(57) ABSTRACT

In a phase locked loop composed of digital circuits, the circuit scale of a circuit that generates phase difference information is reduced. A multi-phase clock generation circuit generates a plurality of feedback clock signals having different phases. A feedback side frequency divider divides frequencies of the plurality of feedback clock signals and outputs the feedback clock signals as frequency-divided clock signals. A reference clock latch circuit holds the frequency-divided clock signals in synchronization with a reference clock signal and outputs a held value. A control circuit controls the frequencies of the plurality of feedback clock signals on the basis of the held value.

13 Claims, 22 Drawing Sheets

(58) Field of Classification Search
USPC .......................................................... 375/376
See application file for complete search history.

(56) References Cited

U.S. PATENT DOCUMENTS

| | | | | |
|---|---|---|---|---|
| 2011/0025382 A1* | 2/2011 | van der Wel | ............. | G06F 7/68 |
| | | | | 327/156 |
| 2012/0027143 A1* | 2/2012 | Wang | ..................... | H03K 5/131 |
| | | | | 375/354 |
| 2012/0229179 A1* | 9/2012 | Sano | ..................... | H03L 7/0991 |
| | | | | 327/115 |
| 2016/0173075 A1 | 6/2016 | Tanihira | | |

FOREIGN PATENT DOCUMENTS

| | | |
|---|---|---|
| JP | 2016-116097 A | 6/2016 |
| WO | 2019/010088 A1 | 1/2019 |

\* cited by examiner

Fig. 12

| VFRAC[3:0] | | | | Φ (FRACTIONAL PART) | SIGN (POLARITY) |
|---|---|---|---|---|---|
| [0] | [1] | [2] | [3] | | |
| 0 | 0 | 0 | 0 | 0.00 | 0 |
| 0 | 0 | 0 | 1 | 0.25 | Don't Care |
| 0 | 0 | 1 | 1 | 0.50 | Don't Care |
| 0 | 1 | 1 | 1 | 0.75 | 1 |
| 1 | 1 | 1 | 1 | 1.00 | 0 |
| 1 | 1 | 1 | 0 | 1.25 | Don't Care |
| 1 | 1 | 0 | 0 | 1.50 | Don't Care |
| 1 | 0 | 0 | 0 | 1.75 | 1 |

# PHASE LOCKED LOOP, ELECTRONIC DEVICE, AND METHOD FOR CONTROLLING PHASE LOCKED LOOP

CROSS REFERENCE TO RELATED APPLICATIONS

This application is a U.S. National Phase of International Patent Application No. PCT/JP2020/009912 filed on Mar. 9, 2020, which claims priority benefit of Japanese Patent Application No. JP 2019-106423 filed in the Japan Patent Office on Jun. 6, 2019. Each of the above-referenced applications is hereby incorporated herein by reference in its entirety.

TECHNICAL FIELD

The present technology relates to a phase locked loop, an electronic device, and a method for controlling the phase locked loop. More specifically, the present technology relates to a phase locked loop using a digitally controlled oscillator, an electronic device, and a method for controlling the phase locked loop.

BACKGROUND ART

Recently, an all-digital phase locked loop (ADPLL) that is a phase locked loop (PLL) in which all components are digitalized has been used in wireless communication device and the like owing to reduction in a chip area and easy low-voltage operation. For example, an ADPLL using a digitally controlled oscillator (DCO) and a time-to-digital converter (TDC) has been proposed (refer to PTL 1, for example). In this ADPLL, a control circuit such as a counter or an adder is provided following the TDC and the DCO is disposed following the control circuits. The DCO generates an output clock signal according to a control signal from the control circuit. The TDC generates phase difference information about a phase difference between a reference clock signal and the output clock signal according to delay elements and flip-flops of a plurality of stages. In addition, the control circuit controls a frequency of the output clock signal according to a control signal on the basis of the phase difference information.

CITATION LIST

Patent Literature

[PTL 1]
JP 2010-199810 A

SUMMARY

Technical Problem

The above-described conventional technology reduces a phase error between the reference clock signal and the output clock signal by improving the time resolution of the TDC. However, to improve the time resolution of the TDC, it is necessary to increase the number of stages of delay elements and flip-flops in the TDC which generates a problem that the circuit scale of the ADPLL increases.

The present technology has been devised in such circumstances and an object of the present technology is to reduce a circuit scale of a circuit that generates phase difference information in a phase locked loop composed of digital circuits.

Solution to Problem

The present technology is devised to solve the aforementioned problems and a first aspect thereof is a phase locked loop including a multi-phase clock generation circuit configured to generate a plurality of feedback clock signals having different phases, a feedback side frequency divider configured to divide frequencies of the plurality of feedback clock signals and to output the feedback clock signals as frequency-divided clock signals, a reference clock latch circuit configured to hold the frequency-divided clock signals in synchronization with a predetermined reference clock signal and to output a held value, and a control circuit configured to control the frequencies of the plurality of feedback clock signals on the basis of the held value, and a method for controlling the same. Accordingly, the effect that a frequency of a feedback clock signal is controlled on the basis of a phase difference between the feedback clock signal and the reference clock signal is obtained.

Furthermore, in the first aspect, the reference clock latch circuit may output the held value as a fractional part code representing a fractional part of a phase difference between the reference clock signal and any of the plurality of feedback clock signals, and the control circuit may include a feedback side accumulator configured to integrate a predetermined value in synchronization with any of the frequency-divided clock signals and to output an integrated value, a retiming circuit configured to hold the reference clock signal in synchronization with any of the plurality of feedback clock signals and to output the reference clock signal as a retiming clock signal, an integrated value latch circuit configured to hold the integrated value in synchronization with the retiming clock signal and to output the held value as an integral part code representing an integral part of the phase difference, a correction circuit configured to obtain a correction value for the phase difference representing the integral part code and the fractional part code, and a phase comparator configured to correct the phase difference according to the correction value and to output phase difference information representing the corrected phase difference. Accordingly, the effect that the phase difference is corrected is obtained.

Furthermore, in the first aspect, the multi-phase clock generation circuit may be a digitally controlled oscillator configured to generate the plurality of feedback clock signals. Accordingly, the effect that a plurality of feedback clock signals are generated by the digitally controlled oscillator is obtained.

Furthermore, in the first aspect, the multi-phase clock generation circuit may include a digitally controlled oscillator configured to generate a predetermined output clock signal, and an output side frequency divider configured to divide a frequency of the output clock signal to convert the output clock signal into the plurality of feedback clock signals having multiple phases. Accordingly, the effect that a plurality of feedback clock signals are generated according to frequency division and conversion into multiple phases of the output of the digitally controlled oscillator is obtained.

Furthermore, in the first aspect, the feedback side frequency divider may be a counter. Accordingly, the effect that frequencies of feedback clock signals are divided by the counter is obtained.

Furthermore, in the first aspect, the counter may include multi-stage flip-flops, and an inverted signal of an output of a last one of the multi-stage flip-flops may be input to a leading one of the multi-stage flip-flops. Accordingly, the effect that frequencies of feedback clock signals are divided by a Johnson counter is obtained.

Furthermore, in the first aspect, the multi-phase clock generation circuit may generate two feedback clock signals, and the feedback side frequency divider may generate four frequency-divided clock signals. Accordingly, the effect that four frequency-divided clock signals are generated from two feedback clock signals is obtained.

Furthermore, in the first aspect, the multi-phase clock generation circuit may generate three feedback clock signals, and the feedback side frequency divider may generate three frequency-divided clock signals. Accordingly, the effect that three frequency-divided clock signals are generated from three feedback clock signals is obtained.

Furthermore, in the first aspect, the multi-phase clock generation circuit may generate three feedback clock signals, and the feedback side frequency divider may generate six frequency-divided clock signals. Accordingly, the effect that six frequency-divided clock signals are generated from three feedback clock signals is obtained.

Furthermore, in the first aspect, the counter may include multi-stage flip-flops, and an inverted value of an output signal of a leading one of the multi-stage flip-flops may be input to the leading one. Accordingly, the effect that a phase difference between flip-flops in a previous stage and the following stage becomes a ¼ period or a ¾ period is obtained.

Furthermore, in the first aspect, an output signal of a previous stage may be input to the following stage in the multi-stage flip-flops. Accordingly, the effect that a phase difference between flip-flops in a previous stage and the following stage becomes a ¼ period is obtained.

Furthermore, in the first aspect, an inverted value of an output signal of a previous stage may be input to the following stage in the multi-stage flip-flops. Accordingly, the effect that a phase difference between flip-flops in a previous stage and the following stage becomes a ¾ period is obtained.

Furthermore, a second aspect of the present technology is an electronic device including a multi-phase clock generation circuit configured to generate a plurality of feedback clock signals having different phases, a feedback side frequency divider configured to divide frequencies of the plurality of feedback clock signals and to output the feedback clock signals as frequency-divided clock signals, a reference clock latch circuit configured to hold the frequency-divided clock signals in synchronization with a predetermined reference clock signal and to output a held value, a control circuit configured to control the frequencies of the plurality of feedback clock signals on the basis of the held value, and a processing circuit configured to perform predetermined processing in synchronization with any of the plurality of feedback clock signals. Accordingly, the effect that predetermined processing is executed in synchronization with a feedback clock signal having a frequency controlled on the basis of a phase difference between the feedback clock signal and the reference clock signal is obtained.

BRIEF DESCRIPTION OF DRAWINGS

FIG. 12 is a diagram illustrating an example of a phase difference and a polarity signal corresponding to a fractional part code in the first embodiment of the present technology.

DESCRIPTION OF EMBODIMENTS

Hereinafter, modes for implementing the present technology (hereinafter also referred to as embodiments) will be described. The description will be made in the following order.

1. First embodiment (example of generating multiple feedback clock signals)
2. Second embodiment (example of generating multiple feedback clock signals and causing setup time to have margin)
3. Third embodiment (example of generating 2-phase feedback clock signal)
4. Fourth embodiment (example of generating 3-phase frequency-divided clock signal from 3-phase feedback clock signal)
5. Fifth embodiment (example of generating 6-phase frequency-divided clock signal from 3-phase feedback clock signal)

1. First Embodiment

Configuration Example of Electronic Device

Figure 1:
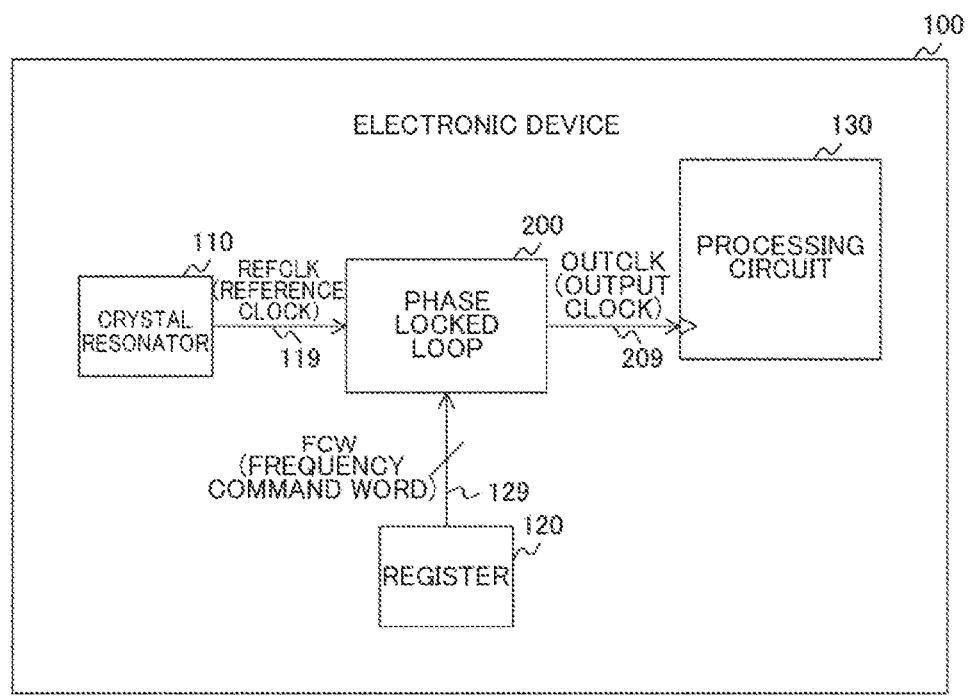
FIG. 1 is a block diagram illustrating a configuration example of an electronic device in a first embodiment of the present technology.

FIG. 1 is a block diagram illustrating a configuration example of an electronic device 100 according to a first embodiment of the present technology. The electronic device 100 performs various types of processing such as signal processing and communication processing and includes a crystal resonator 110, a register 120, a processing circuit 130, and a phase locked loop 200. As the electronic device 100, an acoustic device or a wireless communication device may be conceived.

The crystal resonator 110 generates a reference clock signal REFCLK at a predetermined frequency using the piezoelectric effect of a crystal. For example, a signal at 6 to 27 MHz may be generated as the reference clock signal REFCLK. The crystal resonator 110 supplies the generated reference clock signal REFCLK to the phase locked loop 200 through a signal line 119.

The register 120 holds a frequency command word (FCW) for commanding a frequency of an output clock signal OUTCLK. This frequency command word FCW is read by the phase locked loop 200 through a signal line 129.

The phase locked loop 200 multiplies the reference clock signal REFCLK according to the frequency command word FCW. The phase locked loop 200 supplies the multiplied clock signal to the processing circuit 130 as the output clock signal OUTCLK through a signal line 209.

The processing circuit 130 performs predetermined processing such as signal processing or communication processing in synchronization with the output clock signal OUTCLK.

Configuration Example of Phase Locked Loop

Figure 2:
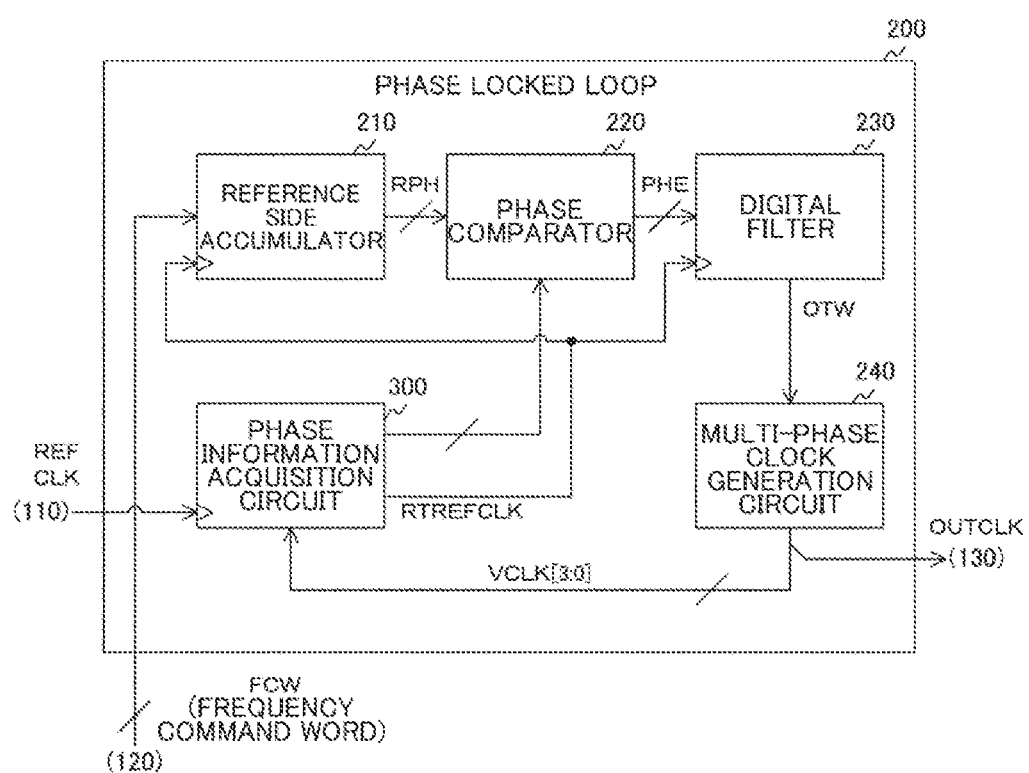
FIG. 2 is a block diagram illustrating a configuration example of a phase locked loop in the first embodiment of the present technology.

FIG. 2 is a block diagram illustrating a configuration example of the phase locked loop 200 in the first embodiment of the present technology. The phase locked loop 200 includes a reference side accumulator 210, a phase comparator 220, a digital filter 230, a multi-phase clock generation circuit 240, and a phase information acquisition circuit 300.

The reference side accumulator 210 integrates a value indicated by the frequency command word FCW in synchronization with a retiming clock signal RTREFCLK. The reference side accumulator 210 supplies an integrated value code RPH indicating the integrated value to the phase comparator 220.

The phase comparator 220 generates phase difference information PHE using the integrated value code RPH and information from the phase information acquisition circuit 300. The phase difference information PHE represents a phase difference between the reference clock signal REFCLK and the output clock signal OUTCLK. The phase comparator 220 supplies the phase difference information PHE to the digital filter 230.

The digital filter 230 reduces noise of the phase difference information PHE in synchronization with the retiming clock signal RTREFCLK. The phase difference information PHE that has passed through the digital filter 230 is supplied to the multi-phase clock generation circuit 240 as an oscillator tuning word (OTW). As the digital filter 230, for example, a low pass filter may be used.

The multi-phase clock generation circuit 240 generates a plurality of feedback clock signals VCLK having different phases according to the oscillator tuning word OTW. Frequencies of the feedback clock signals VCLK are controlled by the oscillator tuning word OTW. For example, 4-phase feedback clock signals VCLK may be generated. Hereinafter, feedback clock signals with 0-th to third phases are represented as VCLK[0] to VCLK[3] and collectively represented as VCLK[3:0] or simply VCLK. The multi-phase clock generation circuit 240 feeds back these feedback clock signals VCLK to the phase information acquisition circuit 300. In addition, the multi-phase clock generation circuit 240 outputs any (e.g., VCLK[3]) of these feedback clock signals VCLK to the processing circuit 130 as the output clock signal OUTCLK.

The phase information acquisition circuit 300 acquires information about a phase difference between the reference clock signal REFCLK and the output clock signal OUTCLK. The phase information acquisition circuit 300 acquires information about a phase difference from the reference clock signal REFCLK and the feedback clock signals VCLK[3:0] and supplies the information to the phase comparator 220.

Further, the phase information acquisition circuit 300 holds the reference clock signal REFCLK in synchronization with any of the feedback clock signals VCLK[3:0] and outputs the reference clock signal REFCLK to the reference side accumulator 210 and the digital filter 230 as the retiming clock signal RTREFCLK.

The above-described reference side accumulator 210, phase comparator 220, digital filter 230, multi-phase clock generation circuit 240, and phase information acquisition circuit 300 are all digital circuits. In this manner, a PLL in which all components are digitalized is called an ADPLL.

Configuration Example of Reference Side Accumulator

Figure 3:
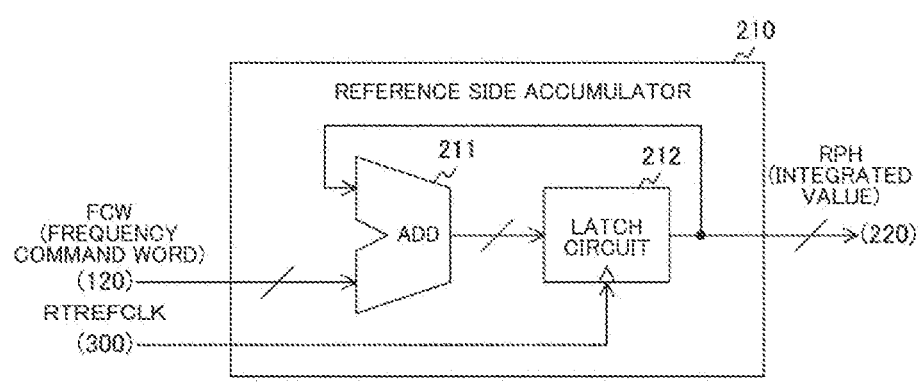
FIG. 3 is a block diagram illustrating a configuration example of a reference side accumulator in the first embodiment of the present technology.

FIG. 3 is a block diagram illustrating a configuration example of the reference side accumulator 210 in the first embodiment of the present technology. The reference side accumulator 210 includes an adder 211 and a latch circuit 212.

The adder 211 adds the predetermined value indicated by the frequency command word FCW to the integrated value indicated by the integrated value code RPH. The adder 211 supplies the added up value to the latch circuit 212.

The latch circuit 212 holds the added up value in synchronization with the retiming clock signal RTREFCLK and supplies the added up value to the adder 211 and the phase comparator 220 as the integrated value code RPH.

Configuration Example of Phase Comparator

Figure 4:
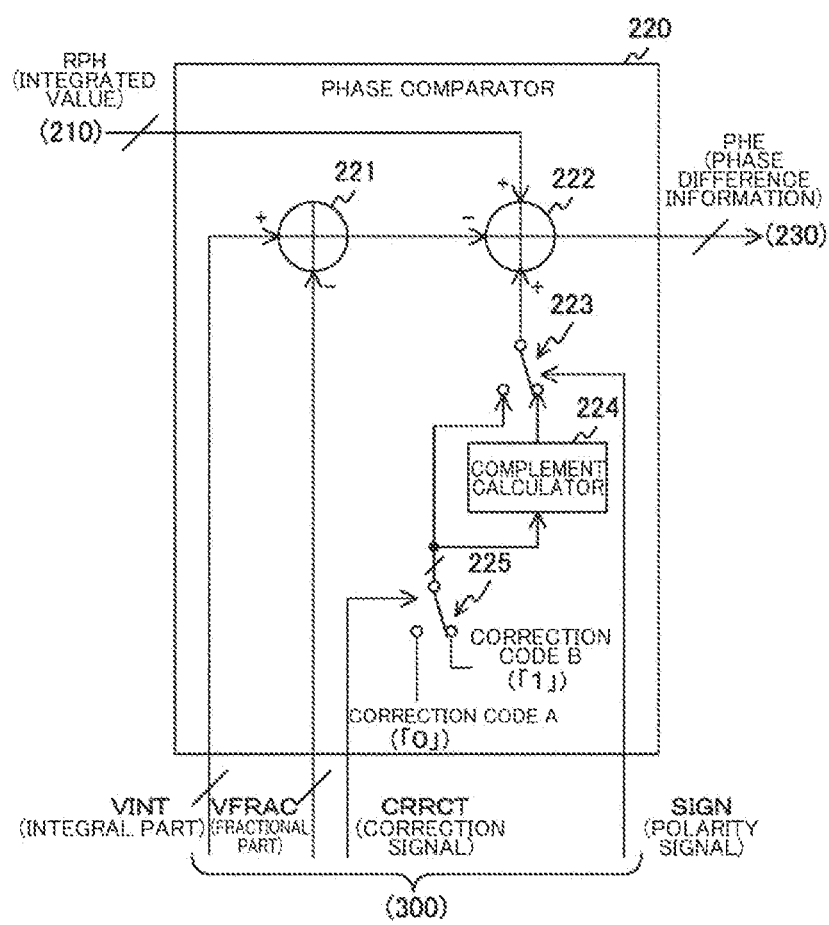
FIG. 4 is a circuit diagram illustrating a configuration example of a phase comparator in the first embodiment of the present technology.

FIG. 4 is a circuit diagram illustrating a configuration example of the phase comparator 220 in the first embodiment of the present technology. The phase comparator 220 includes adders 221 and 222, switches 223 and 225, and a complement calculator 224.

In addition, an integral part code VINT, a fractional part code VFRAC, a correction signal CRRCT, and a polarity signal SIGN are supplied from the phase information acquisition circuit 300 to the phase comparator 220 as information about a phase difference. The integral part code VINT represents an integral part of the phase difference and the fractional part code VFRAC represents a fractional part of the phase difference.

In addition, the correction signal CRRCT designates a correction value for the phase difference. For example, a bit that designates either of "0" or "1" in decimal as a correction value may be used as the correction signal CRRCT.

The polarity signal SIGN designates a polarity of the correction value. For example, a bit that designates either of "+" or "−" may be used as the polarity signal SIGN.

The adder 221 adds up complements of the integral part code VINT and the fractional part code VFRAC (in other words, subtracts the fractional part code VFRAC from the integral part code VINT). The adder 221 supplies the added up value to the adder 222.

The switch 225 selects either of correction codes A and B according to the correction signal CRRCT and supplies the selected correction code to the switch 223 and the complement calculator 224. Here, the correction code A is a code having a predetermined number of bits (in other words, digits) representing a correction value of "0" in decimal and the correction code B is a code having a predetermined number of bits representing a correction value of "1" in decimal.

The complement calculator 224 calculates a complement of the correction code. For example, a complement of 2 is calculated by reversing a bit of each digit and adding "1" thereto. The complement calculator 224 supplies the complement to the switch 223.

The switch 223 selects either of the correction code ("0" or "1") from the switch 225 or the complement thereof according to the polarity signal SIGN. When the polarity signal SIGN represents "+", the switch 223 selects the correction code and supplies the correction code to the adder 222. On the other hand, when the polarity signal SIGN represents "−", the switch 223 selects the complement of the correction code and supplies the complement to the adder 222.

The adder 222 adds up the complement of the added up value from the adder 221, the integrated value code RPH, and the output (correction code or complement) of the switch 223. The adder 222 supplies the added up value to the digital filter 230 as phase difference information PHE.

According to the above-described configuration, an arithmetic operation represented by the following formula is executed in the phase comparator 220.

$$Phe = Vint - Vfrac + Rph \pm (\text{correction value}) \ldots \quad \text{Formula 1}$$

In the above formula, Phe is a phase difference indicated by phase difference information PHE and is represented as, for example, a real number in decimal. Vint is an integer value indicated by the integral part code VINT. Vfrac is a real number value indicated by the fractional part code VFRAC. Rph is an integrated value indicated by the integrated value code RPH. A sign of a correction value is designated by the polarity signal SIGN. Further, a correction value is "0" or "1" in decimal, and which one is used is designated by the correction signal CRRCT.

Configuration Example of Multi-Phase Clock Generation Circuit

Figure 5:
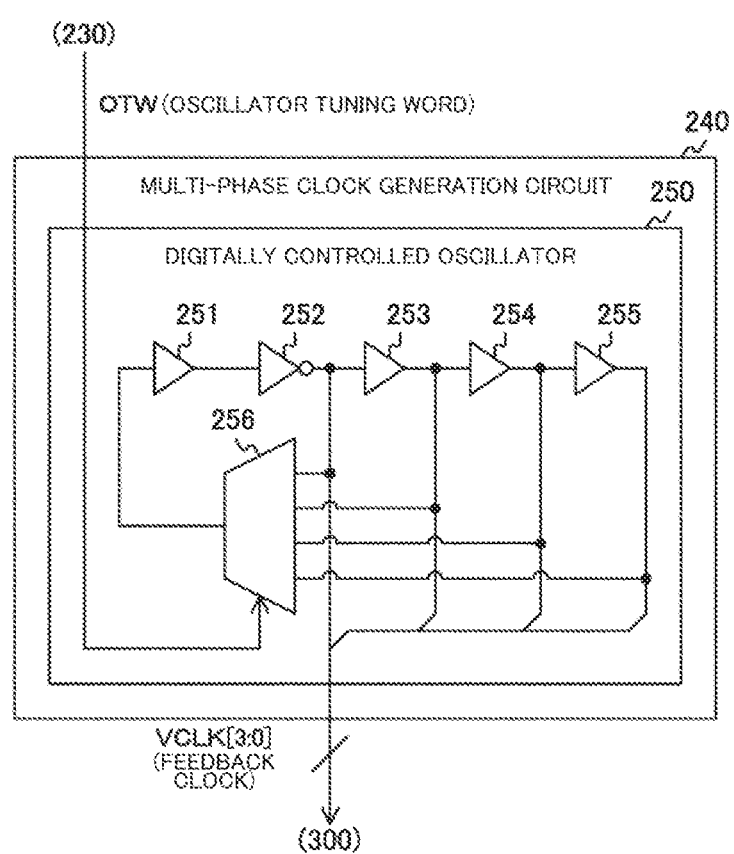
FIG. 5 is a circuit diagram illustrating a configuration example of a multi-phase clock generation circuit in the first embodiment of the present technology.

FIG. 5 is a circuit diagram illustrating a configuration example of the multi-phase clock generation circuit 240 in the first embodiment of the present technology. The multi-phase clock generation circuit 240 includes a digitally controlled oscillator 250.

The digitally controlled oscillator 250 generates a plurality of feedback clock signals VCLK having different phases according to the oscillator tuning word OTW. The digitally controlled oscillator 250 includes, for example, buffers 251, 253, 254, and 255, an inverter 252, and a selector 256.

The buffer 251 delays an output signal of the selector 256 and supplies the delayed signal to the inverter 252. The inverter 252 inverts and delays the output signal of the buffer 251 and supplies the inverted and delayed signal to the buffer 253. The buffer 253 delays the output signal of the inverter 252 and supplies the delayed signal to the buffer 254. The buffer 254 delays the output signal of the buffer 253 and supplies the delayed signal to the buffer 255. The buffer 255 delays the output signal of the buffer 254.

In addition, the output signals of the inverter 252 and the buffers 253, 254, and 255 are supplied to the selector 256 and the phase information acquisition circuit 300 as the feedback clock signals VCLK[3:0].

The selector 256 selects any of the output signals of the inverter 252 and the buffers 253, 254, and 255 according to the oscillator tuning word OTW and outputs the selected output signal to the buffer 251.

Although the number of stages of delay elements (the buffers and the inverter) may be 5, the number of stages is not limited to 5. Further, although the digitally controlled oscillator 250 may decompose the output signal of the inverter 252 into 4 phases, the number of phases into which the output signal is decomposed is not limited to 4 and may be 2 or 3 as will be described later.

Configuration Example of Phase Information Acquisition Circuit

Figure 6:
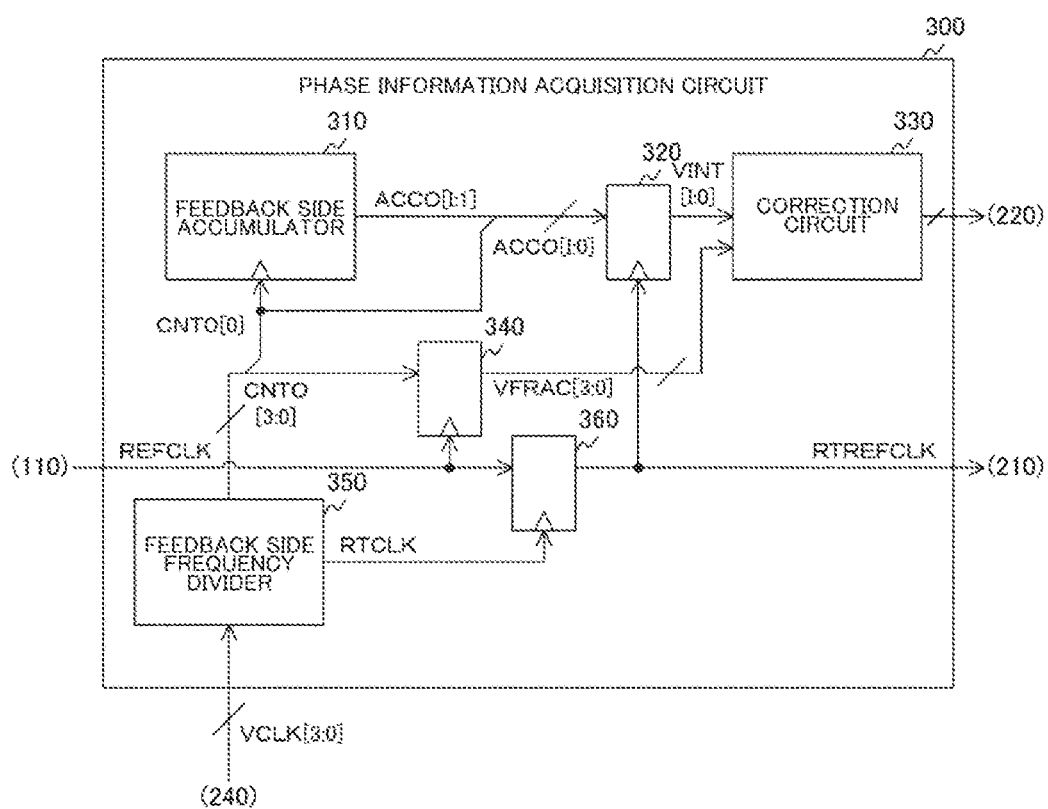
FIG. 6 is a circuit diagram illustrating a configuration example of a phase information acquisition circuit in the first embodiment of the present technology.

FIG. 6 is a circuit diagram illustrating a configuration example of the phase information acquisition circuit 300 in the first embodiment of the present technology. The phase information acquisition circuit 300 includes a feedback side accumulator 310, an integrated value latch circuit 320, a correction circuit 330, a frequency-divided clock latch circuit 340, a feedback side frequency divider 350, and a retiming circuit 360.

The feedback side frequency divider 350 divides the frequencies of the feedback clock signals VCLK[3:0] and outputs the frequency-divided feedback clock signals as frequency-divided clock signals CNTO[3:0]. The frequency-divided clock signal CNTO[0] among the frequency-divided clock signals CNTO[3:0] is supplied to the feedback side accumulator 310 and the integrated value latch circuit 320. Further, the frequency-divided clock signals CNTO[3:0] are supplied to the frequency-divided clock latch circuit 340.

The feedback side accumulator 310 integrates a predetermined value in synchronization with the frequency-divided clock signal CNTO[0] from the feedback side frequency divider 350. The feedback side accumulator 310 outputs an integrated value code ACCO with I-1 bits (I is an integer) representing an integrated value. An I-bit integrated value code ACCO obtained by combining a 0-th bit, that is, the least significant bit (LSB), of the frequency-divided clock signal CNTO[0] with the (I-1)-bit integrated value code ACCO is supplied to the integrated value latch circuit 320.

The frequency-divided clock latch circuit 340 holds the frequency-divided clock signals CNTO[3:0] in synchronization with the reference clock signal REFCLK and outputs the held values to the correction circuit 330 as a fractional part code VFRAC[3:0].

The retiming circuit 360 holds the reference clock signal REFCLK in synchronization with a retiming clock signal RTCLK (i.e., the frequency-divided clock signal CNTO[0]) and outputs the held reference clock signal REFCLK as the retiming clock signal RTREFCLK.

The integrated value latch circuit 320 holds the I-bit integrated value code ACCO[I:0] in synchronization with the retiming clock signal RTREFCLK from the retiming circuit 360 and outputs the held I-bit integrated value code ACCO[I:1] to the correction circuit 330 as an integral part code VINT[I:0].

The correction circuit 330 obtains a correction value for a phase difference represented by the integral part code VINT[I:0] and the fractional part code VFRAC[3:0] from the integral part code VINT[I:0] and the fractional part code VFRAC[3:0]. The correction circuit 330 generates a signal representing the obtained correction value and supplies the signal to the phase comparator 220 along with the integral part code VINT[I:0] and the fractional part code VFRAC[3:0].

Meanwhile, although the frequency-divided clock signals CNTO[3:0] have 4 phases and the size of the fractional part code VFRAC[3:0] is 4 bits, the present technology is not limited to this configuration. For example, when the feedback clock signals VCLK have 2 phases or 3 phases, 2-phase or 3-phase frequency-divided clock signals CNTO and a 2-bit or 3-bit fractional part code VFRAC may be used.

Configuration Example of Feedback Side Accumulator

Figure 7:
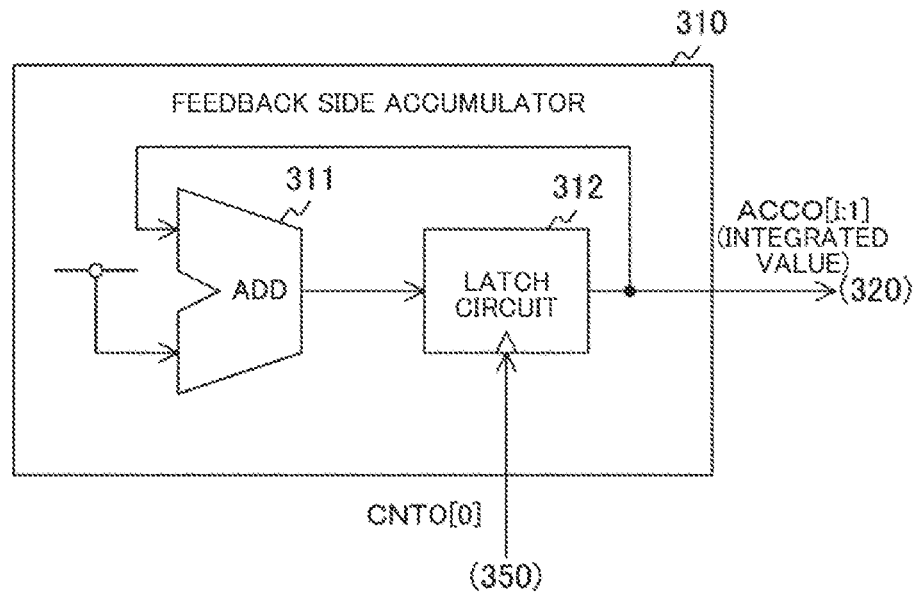
FIG. 7 is a block diagram illustrating a configuration example of a feedback side accumulator in the first embodiment of the present technology.

FIG. 7 is a block diagram illustrating a configuration example of the feedback side accumulator 310 in the first embodiment of the present technology. The feedback side accumulator 310 includes an adder 311 and a latch circuit 312.

The adder 311 adds a predetermined value (e.g., "1") to the integrated value code ACCO[I:1] output from the latch circuit 312. The adder 311 supplies the added up value to the latch circuit 312.

The latch circuit 312 holds the added up value as the integrated value code ACCO[I:1] in synchronization with the frequency-divided clock signal CNTO[0] and outputs the integrated value code ACCO[I:1] to the integrated value latch circuit 320.

Configuration Example of Feedback Side Frequency Divider

Figure 8:
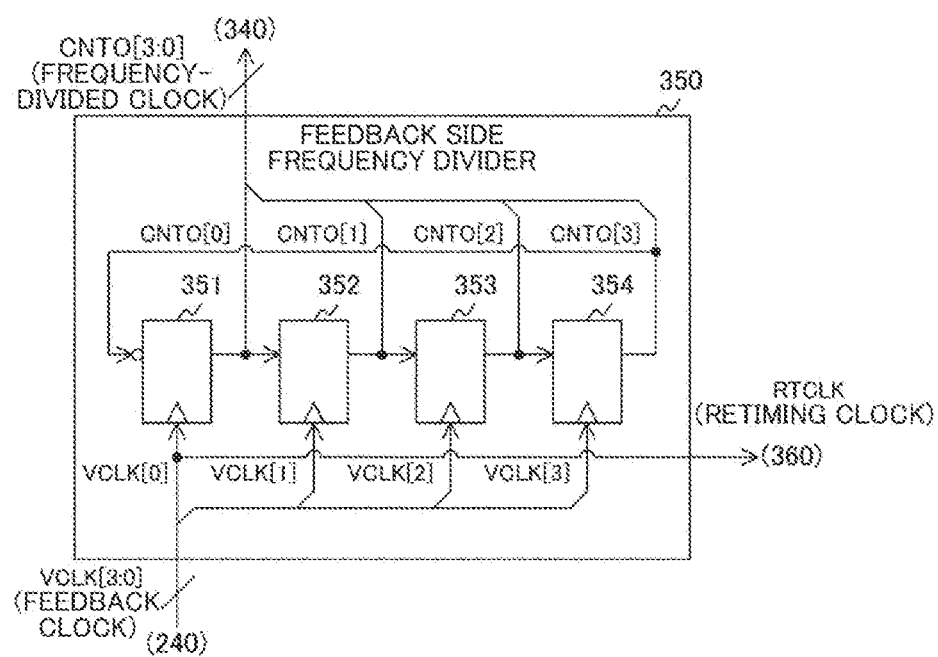
FIG. 8 is a circuit diagram illustrating a configuration example of a feedback side frequency divider in the first embodiment of the present technology.

FIG. 8 is a circuit diagram illustrating a configuration example of the feedback side frequency divider 350 in the first embodiment of the present technology. The feedback side frequency divider 350 includes flip-flops 351 to 354.

The flip-flop 351 holds an inverted value of an output signal of the flip-flop 354 in synchronization with the feedback clock signal VCLK[0] from the multi-phase clock generation circuit 240 and outputs the held value to the flip-flop 352.

The flip-flop 352 holds the output signal of the flip-flop 351 in synchronization with the feedback clock signal VCLK[1] and outputs the held value to the flip-flop 353. The flip-flop 353 holds the output signal of the flip-flop 352 in synchronization with the feedback clock signal VCLK[2] and outputs the held value to the flip-flop 354. The flip-flop 354 holds the output signal of the flip-flop 353 in synchronization with the feedback clock signal VCLK[3] and outputs the held value to the flip-flop 351. In other words, the output signal of a previous stage (flip-flop 351 or the like) is input to the subsequent stage (flip-flop 352 or the like).

Further, the output signals of the flip-flops 351 to 354 are output to the frequency-divided clock latch circuit 340 as frequency-divided clock signals CNTO[0] to CNTO[3].

As exemplified in the figure, a circuit that inverts the output of the last flip-flop of a shift register composed of a plurality of stages of flip-flops and inputs the inverted value to the first flip-flop of the shift register is called a Johnson counter. According to this Johnson counter, the frequencies of the feedback clock signals VCLK[0] to VCLK[3] are divided by 2 and output as frequency-divided clock signals CNTO[0] to CNTO[3].

Further, the feedback clock signal VCLK[0] is supplied to the retiming circuit 360 as the retiming clock signal RTCLK.

According to the above-described configuration, a phase difference between an output signal of a flip-flop (flip-flop 351 or the like) in a certain stage and an output signal of the subsequent flip-flop (flip-flop 352 or the like) becomes a ¼ period.

Figure 9:
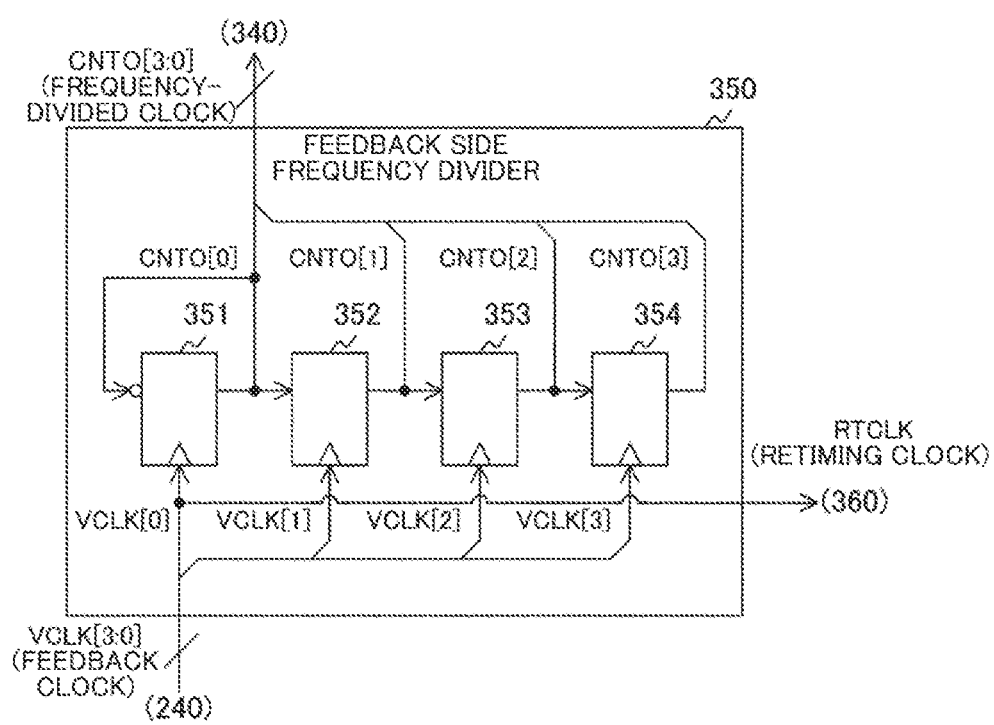
FIG. 9 is a circuit diagram illustrating a configuration example of a feedback side frequency divider having changed connection in the first embodiment of the present technology.

Meanwhile, although the inverted value of the output signal of the last flip-flop 354 is input to the first flip-flop 351 in the feedback side frequency divider 350, the present technology is not limited to this configuration. As exemplified in FIG. 9, a configuration in which the inverted value of the output signal of the flip-flop 351 is input to the flip-flop 351 itself may be employed.

Configuration Example of Frequency-Divided Clock Latch Circuit

Figure 10:
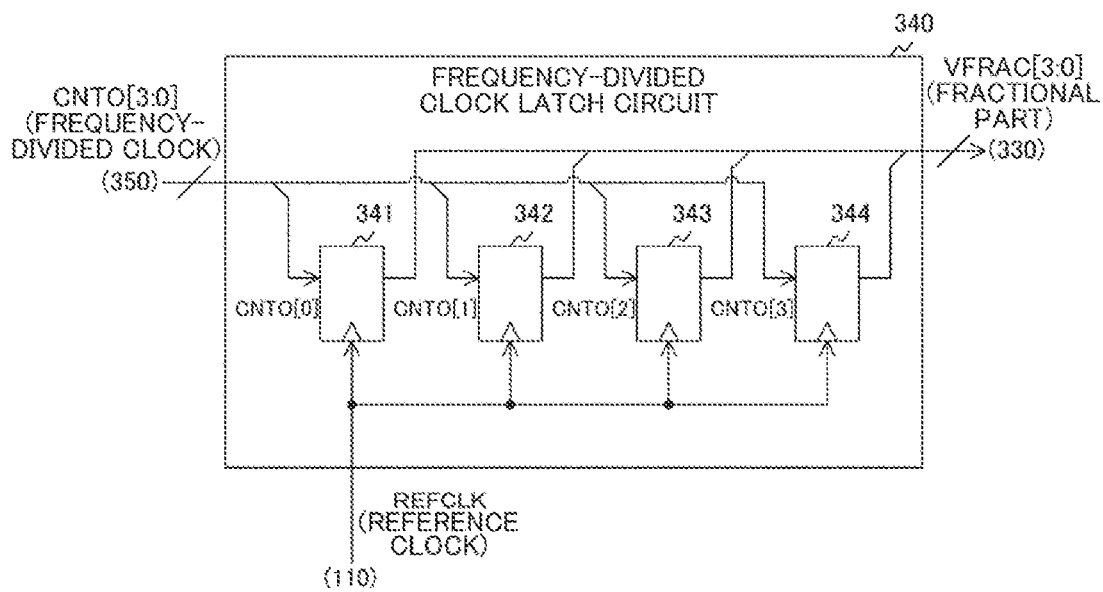
FIG. 10 is a circuit diagram illustrating a configuration example of a frequency-divided clock latch circuit in the first embodiment of the present technology.

FIG. 10 is a circuit diagram illustrating a configuration example of the frequency-divided clock latch circuit 340 in the first embodiment of the present technology. The frequency-divided clock latch circuit 340 includes flip-flops 341 to 344.

The flip-flops 341 to 344 hold the frequency-divided clock signals CNTO[3:0] in synchronization with the reference clock signal REFCLK and outputs the held frequency-divided clock signals to the correction circuit 330 as the fractional part code VFRAC[3:0].

Meanwhile, the configuration of the integrated value latch circuit 320 is the same as that of the frequency-divided clock latch circuit 340 except that the number of flip-flops is I.

Configuration Example of Correction Circuit

Figure 11:
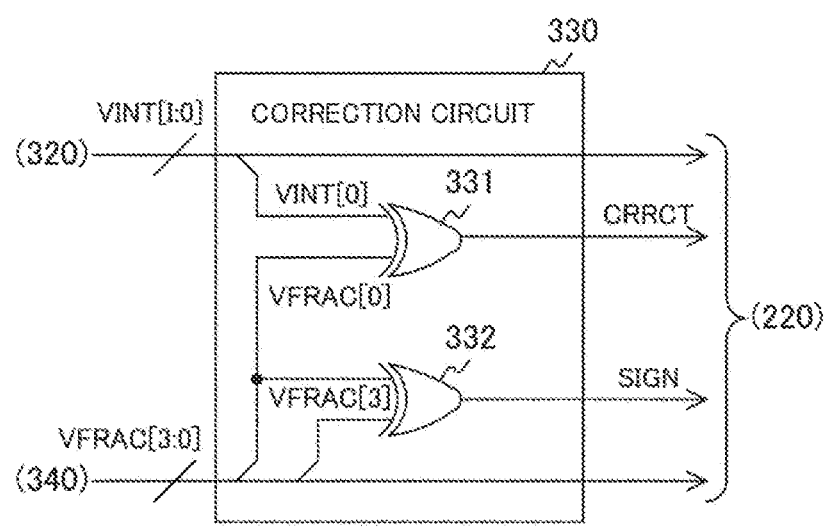
FIG. 11 is a circuit diagram illustrating a configuration example of a correction circuit in the first embodiment of the present technology.

FIG. 11 is a circuit diagram illustrating a configuration example of the correction circuit 330 in the first embodiment of the present technology. The correction circuit 330 includes XOR (exclusive OR) gates 331 and 332.

The XOR gate 331 outputs exclusive OR of the integral part code VINT[0] and the fractional part code VFRAC[0] to the phase comparator 220 as a correction signal CRRCT.

The XOR gate 332 outputs exclusive OR of the fractional part code VFRAC[0] and the fractional part code VFRAC[3] to the phase comparator 220 as a polarity signal SIGN.

Here, the frequency-divided clock signals CNTO[3:0] are latched in synchronization with the reference clock signal REFCLK and outputs as the fractional part code VFRAC [3:0], as exemplified in FIG. 6. Although the reference clock signal REFCLK is not synchronized with the frequency-divided clock signals CNTO[3:0], the signals shift by only 1 bit in the shift register. Accordingly, the accuracy of the fractional part code VFRAC[3:0] is guaranteed even if they shift at the same timing as any of the bits of the reference clock signal REFCLK.

On the other hand, the integrated value code ACCO[I:1] is latched in synchronization with the retiming clock signal RTREFCLK obtained by retiming the feedback clock signal VCLK[0] and output as the integral part code VINT[I:0]. Since the feedback clock signal VCLK[0] is not synchronized with the reference clock signal REFCLK, error corresponding to "1" may be generated in the integral part code VINT[I:0]. What is important is that error is not generated if the integral part code VINT[0] is identical to the fractional part code VFRAC[0], and presence or absence of error can be detected by the XOR gate 331 determining whether this condition is satisfied.

Accordingly, when the integral part code VINT[0] is consistent with the fractional part code VFRAC[0], the XOR gate 331 outputs a correction signal CRRCT of a logic value "0". This correction signal CRRCT designates a correction value of "0" in decimal in Formula 1. Accordingly, a phase difference is not corrected in the phase comparator 220 irrespective of the value of the polarity signal SIGN.

On the other hand, when the integral part code VINT[0] is not consistent with the fractional part code VFRAC[0], the XOR gate 331 outputs a correction signal CRRCT of a logic value "1". This correction signal CRRCT designates a correction value of "1" in decimal in formula 1. The sign of this correction value is designated by the polarity signal SIGN, and a phase difference is corrected according to the correction value of "+1" or "−1".

FIG. 12 is a diagram illustrating an example of a phase difference and a polarity signal corresponding to a fractional part code in the first embodiment of the present technology. When the fractional part code VFRAC[3:0] is "0000" in binary, a fractional part represented by this code is "0.00". In addition, "0" is output as a polarity signal SIGN. This polarity signal SIGN designates a sign of "−".

When the fractional part code VFRAC[3:0] is "0001" in binary, a fractional part represented by this code is "0.25". When the fractional part code VFRAC[3:0] is "0011" in binary, a fractional part represented by this code is "0.50". When the fractional part code VFRAC[3:0] is "0111" in binary, a fractional part represented by this code is "0.75". In addition, "1" is output as the polarity signal SIGN. This polarity signal SIGN designates a sign of "+".

When the fractional part code VFRAC[3:0] is "1111" in binary, a fractional part represented by this code is "1.00". In addition, "0" is output as a polarity signal SIGN. When the fractional part code VFRAC[3:0] is "1110" in binary, a fractional part represented by this code is "1.25". When the fractional part code VFRAC[3:0] is "1100" in binary, a fractional part represented by this code is "1.50". When the fractional part code VFRAC[3:0] is "1000" in binary, a fractional part represented by this code is "1.75". In addition, "1" is output as a polarity signal SIGN.

Figure 13:
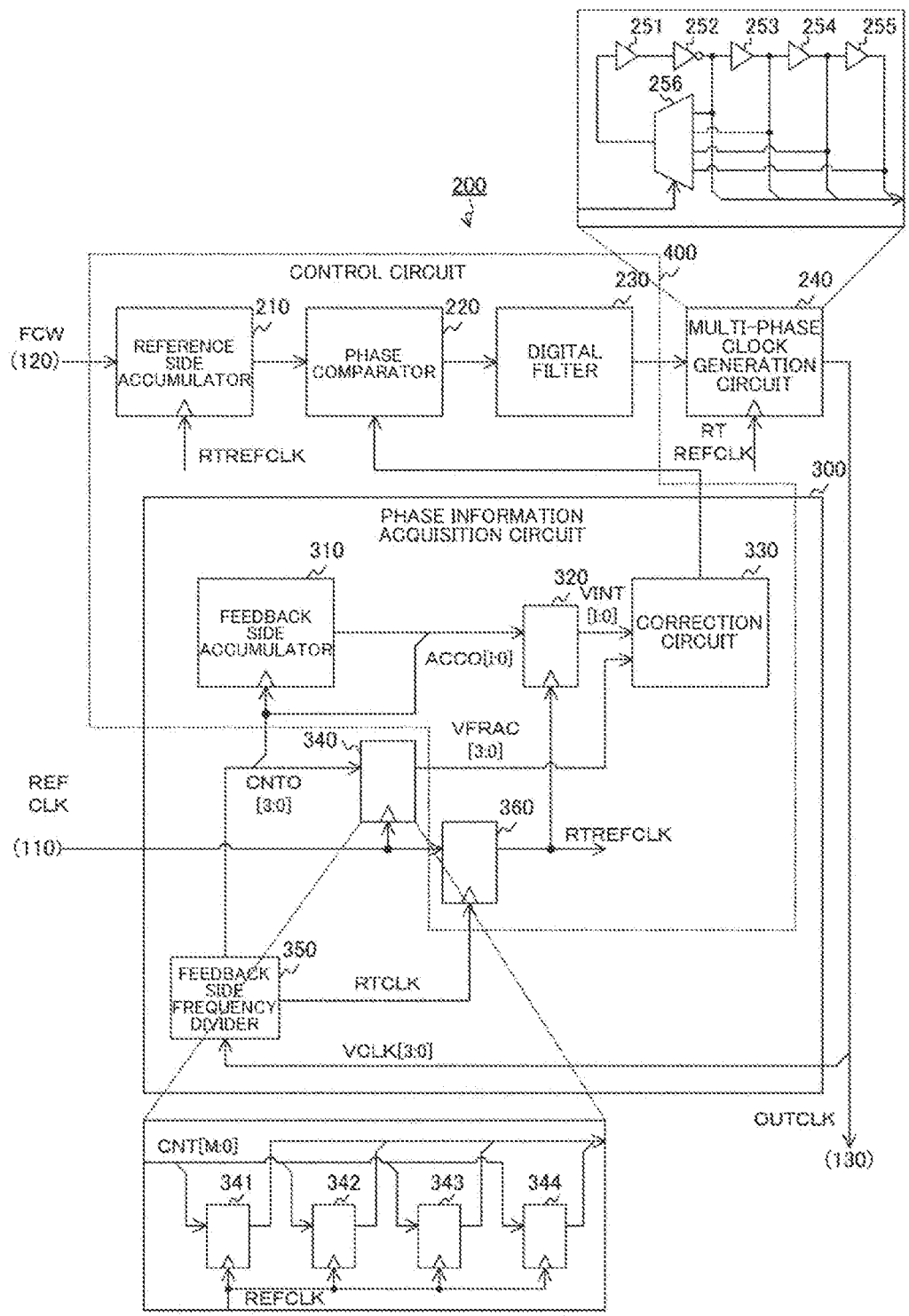
FIG. 13 is a diagram for describing functions of the phase locked loop in the first embodiment of the present technology.

FIG. 13 is a diagram for describing the function of the phase locked loop 200 in the first embodiment of the present technology.

In the figure, a circuit including the reference side accumulator 210, the phase comparator 220, the digital filter 230, and components in the phase information acquisition circuit 300 other than the feedback side frequency divider 350 and the frequency-divided clock latch circuit 340 is assumed to be a control circuit 400.

The multi-phase clock generation circuit 240 generates a plurality of feedback clock signals VCLK having different phases. The feedback side frequency divider 350 divides the frequencies of the feedback clock signals VCLK and outputs the signals as frequency-divided clock signals CNTO. The frequency-divided clock latch circuit 340 holds the frequency-divided clock signals CNTO in synchronization with the reference clock signal REFCLK and outputs the held value as a fractional part code VFRAC. Then, the control circuit 400 controls the frequencies of the plurality of feedback clock signals VCLK on the basis of the fractional part code VFRAC.

The feedback side accumulator 310 in the control circuit 400 integrates a predetermined value in synchronization with a frequency-divided clock signal VCNTO[0] to output an integrated value code ACCO. The retiming circuit 360 holds the reference clock signal REFCLK in synchronization with the feedback clock signal VCLK[0] and outputs the held reference clock signal as the retiming clock signal RTREFCLK. The integrated value latch circuit 320 holds the integrated value code ACCO in synchronization with the retiming clock signal RTREFCLK and outputs the held value as an integral part code VINT. The correction circuit 330 obtains a correction value for a phase difference represented by the integral part code VINT and the fractional part code VFRAC. The reference side accumulator 210 integrates a value represented by a frequency command word FCW in synchronization with the retiming clock signal RTREFCLK and supplies an integrated value code RPH to the phase comparator 220. The phase comparator 220 corrects the phase difference according to the correction value using formula 1 and outputs phase difference information representing the corrected phase difference through the digital filter 230.

Figure 14:
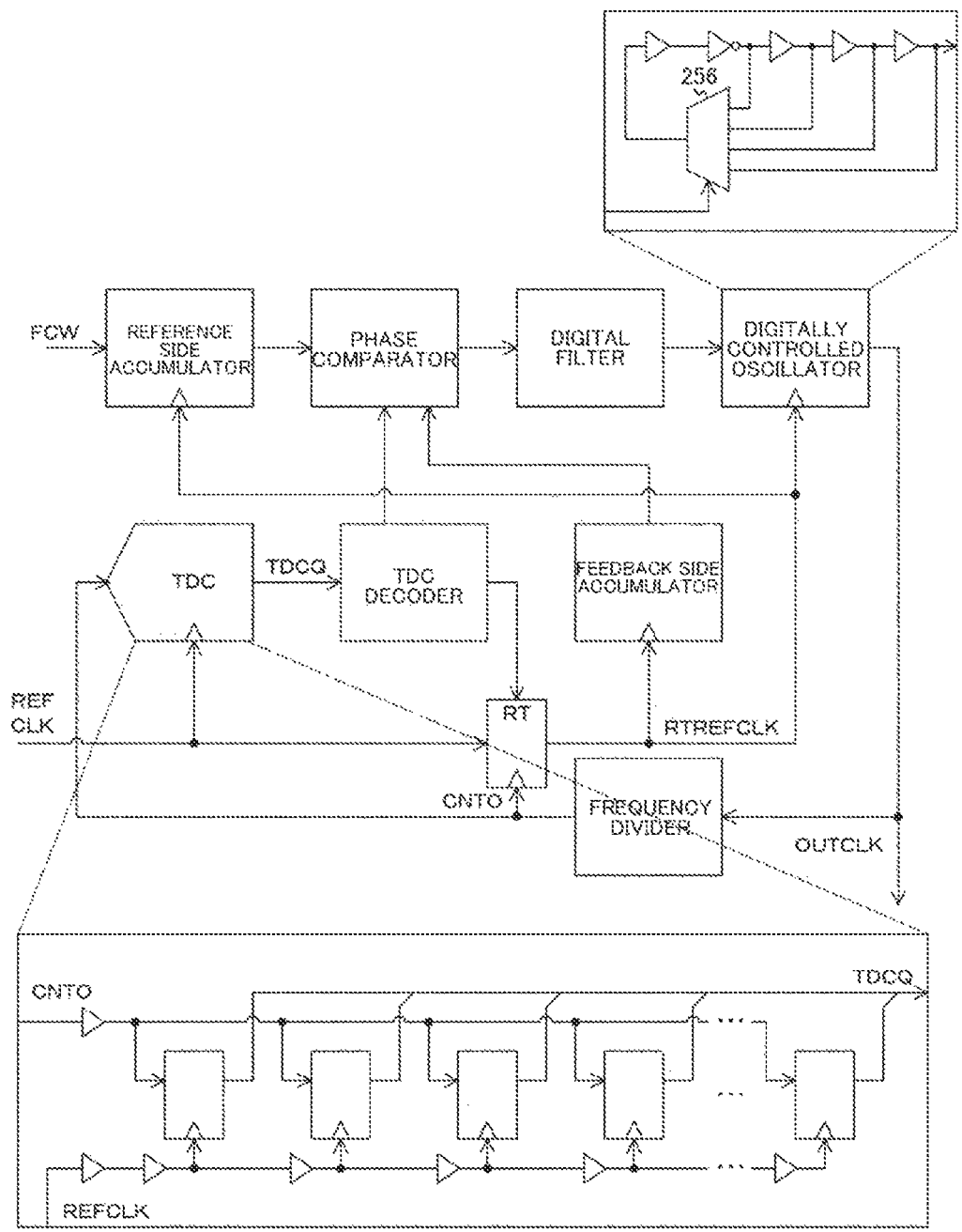
FIG. 14 is a block diagram illustrating a configuration example of an ADPLL in a comparative example.

Here, a general ADPLL using a TDC is conceived as a comparative example. FIG. 14 is a block diagram illustrating a configuration example of an ADPLL in a comparative example. A reference side accumulator, a phase comparator, a digital filter, a digitally controlled oscillator, a TDC, a TDC decoder, a feedback side accumulator, a retiming circuit, and a frequency divider are provided in the ADPLL.

The digitally controlled oscillator outputs a 1-phase output clock signal OUTCLK and the frequency divider divides the frequency of the output clock signal OUTCLK and outputs the output clock signal as frequency-divided clock signals CNTO. Delay elements of a plurality of stages and flip-flops of a plurality of stages are provided in the TDC. According to these elements, the TDC converts the reference clock signal REFCLK into a plurality of phases and holds the frequency-divided clock signals CNTO in synchronization with the phases. Then, the TDC supplies the held value to the TDC decoder as TDCQ. This TDCQ is a code representing a phase difference.

The TDC decoder decodes the TDCQ and supplies the decoded TDCQ to the phase comparator. The retiming circuit RT holds the reference clock signal REFCLK in synchronization with the frequency-divided clock signal VCNTO and supplies the held reference clock signal to the feedback side accumulator, the reference side accumulator, and the digital filter as a retiming clock signal RTREFCLK.

Functions of the reference side accumulator, the phase comparator, and the digital filter shown in FIG. 14 are the same as those of the reference side accumulator 210, the phase comparator 220, and the digital filter 230 shown in FIG. 13.

In comparison of FIG. 13 with FIG. 14, the digitally controlled oscillator of the comparative example outputs a 1-phase clock signal, whereas the multi-phase clock generation circuit 240 outputs a plurality of feedback clock signals having difference phases. In addition, the comparative example includes the TDC and the TDC decoder, whereas the phase locked loop 200 includes the frequency-divided clock latch circuit 340, the integrated value latch circuit 320, and the correction circuit 330 instead of the TDC and the TDC decoder.

As exemplified in FIG. 13, the multi-phase clock generation circuit 240 outputs multi-phase feedback clock signals, and thus the TDC and the TDC decoder are unnecessary. Although the frequency-divided clock latch circuit 340, the integrated value latch circuit 320, and the correction circuit 330 are necessary instead of the TDC and the TDC decoder, the latch circuits are composed of flip-flops of a plurality of stages and thus have a smaller circuit scale than the TDC composed of delay elements of a plurality of stages and flip-flops of a plurality of stages. In addition, the correction circuit 330 includes only the XOR gates 331 and 332 and thus has a smaller circuit scale than the TDC decoder. Accordingly, the circuit scale of the phase locked loop 200 is smaller than the comparative example.

Furthermore, in the comparative example, it is necessary to acquire a fractional part and period information for VCLK period normalization from the output code TDCQ of the TDC, and the number of stages of delay elements needs to cover at least 1.5 periods of VCLK. Accordingly, the circuit scale and current consumption may increase when a variable range of an output frequency is wide.

In addition, in the comparative example, a delay time of the TDC greatly depends on capability of transistors and greatly varies according to a process, a temperature, and a power supply voltage. Accordingly, it is difficult to compensate for a design for variation in the delay time. Furthermore, a multiplier generally having a large circuit scale is necessary for VCLK period normalization of output data of the TDC. Moreover, the comparative example has a little design cost effectiveness with respect to the PLL that does not require jitter performance (in other words, that may have low time resolution of the TDC). To sum up, circuit design cost is high in the comparative example.

In addition, it is difficult to reduce jitter by increasing the rate of the reference clock signal REFCLK (in other words, increasing the range of the PLL) in the comparative example. Further, in the comparative example, it takes a time to acquire metastable avoidance information according to the TDC and the TDC decoder and thus it is difficult to achieve fast operation.

On the other hand, in the phase locked loop 200 that outputs multi-phase feedback clock signals, the circuit scale and current consumption can be reduced because the TDC and the TDC decoder are not necessary. Further, design cost can be reduced and the rate of the reference clock signal REFCLK can be easily increased.

Operation Example of Phase Locked Loop

Next, a case in which the reference clock signal REFCLK and feedback clock signals VCLK have simultaneously shifted is conceived. Here, the following four states should be considered with respect to presence or absence of error.

State 1: VFRAC[0]=VINT[0] and VFAC[3:0]=0.0 or 1.0
State 2: VFRAC[0]=VINT[0] and VFAC[3:0]=0.75 or 1.75
State 3: VFRAC[0]≠VINT[0] and VFAC[3:0]=0.0 or 1.0
State 4: VFRAC[0]≠VINT[0] and VFAC[3:0]=0.75 or 1.75

Figure 15:
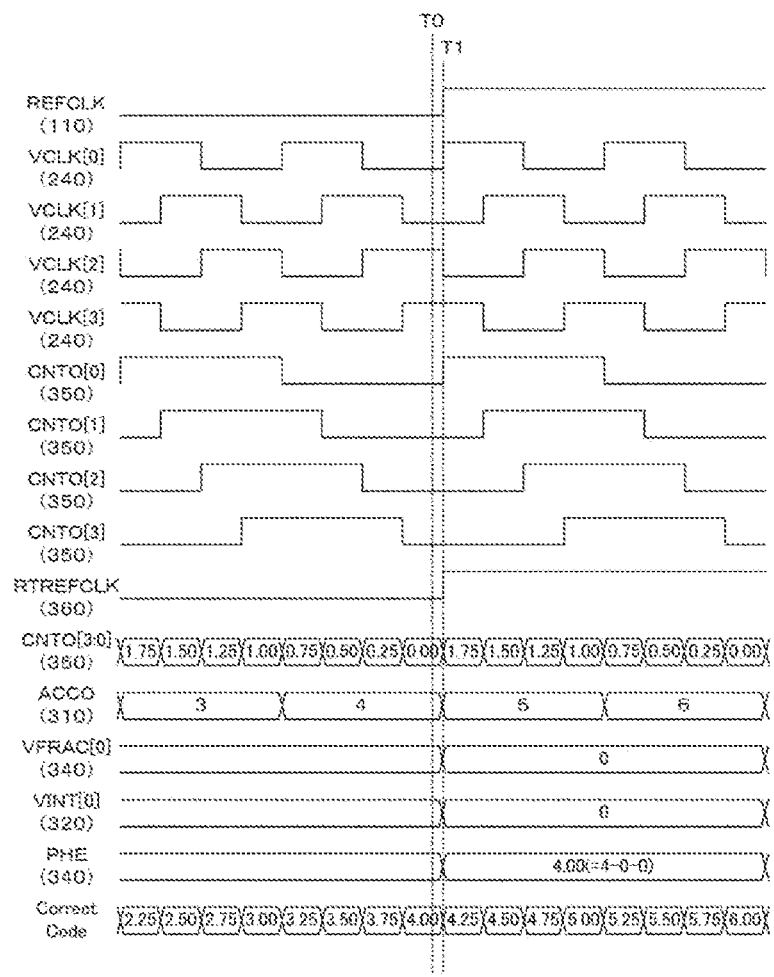
FIG. 15 is a timing chart illustrating an example of an operation of the phase locked loop in state 1 in the first embodiment of the present technology.

FIG. 15 is a timing chart illustrating an example of an operation of the phase locked loop 200 in state 1 in the first embodiment of the present technology. In the figure, "Correct Code" represents an expectation for phase difference information PHE.

At timing T1, the reference clock signal REFCLK, the feedback clock signal VCLK[0], the frequency-divided clock signal CNTO[0], and the retiming clock signal RTREFCLK are assumed to rise. Here, a timing at which the frequency-divided clock latch circuit 340 should perform latching is timing T0 immediately before the timing T1, and an expectation (correct code) is "4" at this time.

When the frequency-divided clock latch circuit 340 has performed latching at timing T0, a fractional part code VFRAC[3:0] representing "0" is output. In addition, when the integrated value latch circuit 320 has performed latching at timing T1, an integral part code VINT[3:0] representing "4" is output. Both the fractional part code VFRAC[0] and the integral part code VINT[0] are "0". Since VFRAC[0] and VINT[0] are consistent with each other, the correction circuit 330 designates a correction value of "0". Accordingly, a phase difference is not corrected. When an integer, a decimal fraction and the correction value in state 1 are put into formula 1, the following formula is obtained.

$$Phe=4-0-0=4\ldots \qquad \text{Formula 2}$$

According to formula 2, phase difference information PHE representing an expectation in state 1 is output.

Figure 16:
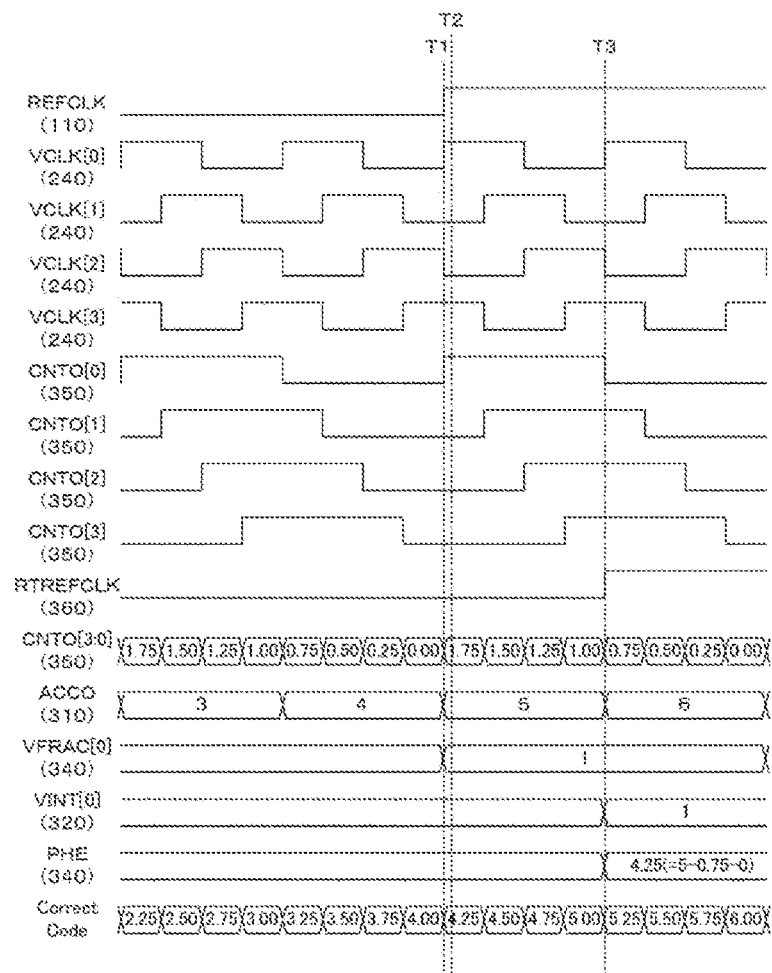
FIG. 16 is a timing chart illustrating an example of an operation of the phase locked loop in state 2 in the first embodiment of the present technology.

FIG. 16 is a timing chart illustrating an example of operation of the phase locked loop 200 in state 2 in the first embodiment of the present technology.

At timing T1, the reference clock signal REFCLK, the feedback clock signal VCLK[0], and the frequency-divided clock signal CNTO[0] are assumed to rise. Then, at timing T3, the feedback clock signal VCLK[0] and the retiming clock signal RTREFCLK are assumed to rise. Here, a timing at which latching should be performed is timing T2 immediately after timing T1, and an expectation at this time is "4.25".

When the frequency-divided clock latch circuit 340 has performed latching at timing T2, a fractional part code VFRAC[3:0] representing "1.75" is output. In addition, when the integrated value latch circuit 320 has performed latching at timing T3, an integral part code VINT[3:0] representing "1" is output. Both the fractional part code VFRAC[0] and the integral part code VINT[0] are "0". Since VFRAC[0] and VINT[0] are consistent with each other, the correction circuit 330 designates a correction value of "0". Accordingly, a phase difference is not corrected. When an integer, a decimal fraction and the correction value in state 2 are put into formula 1, the following formula is obtained.

$$Phe=5-0.75-0=4.25\ldots \qquad \text{Formula 3}$$

According to formula 3, phase difference information PHE representing an expectation in state 2 is output.

Figure 17:
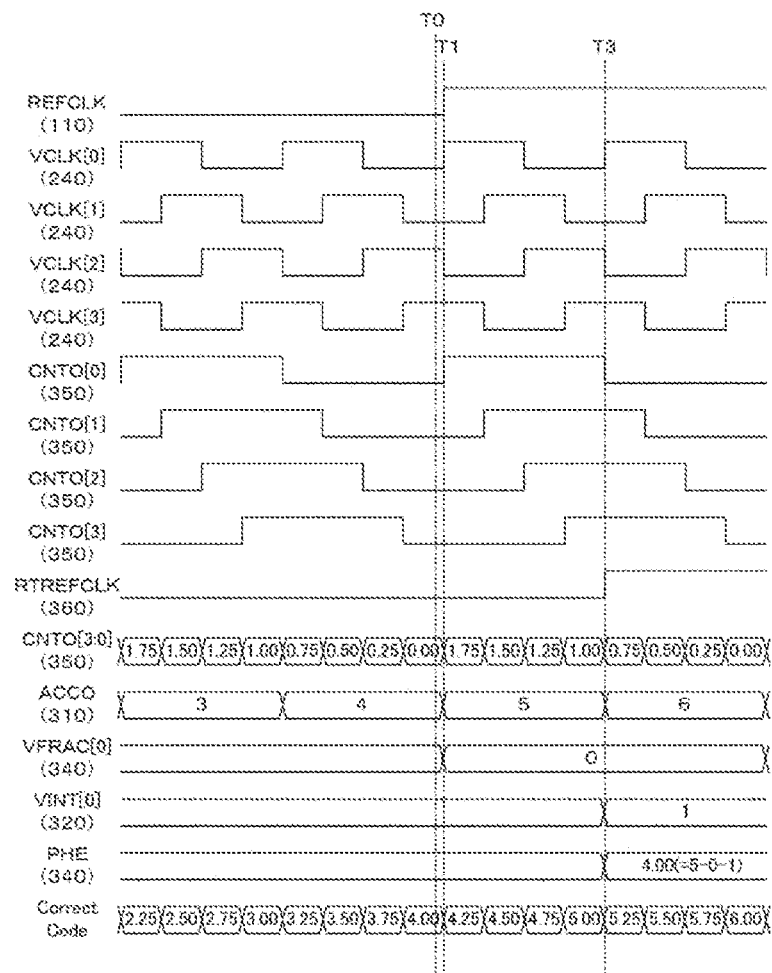
FIG. 17 is a timing chart illustrating an example of an operation of the phase locked loop in state 3 in the first embodiment of the present technology.

FIG. 17 is a timing chart illustrating an example of operation of the phase locked loop 200 in state 3 in the first embodiment of the present technology.

At timing T1, the reference clock signal REFCLK, the feedback clock signal VCLK[0], and the frequency-divided clock signal CNTO[0] are assumed to rise. Then, at timing T3, the feedback clock signal VCLK[0] and the retiming clock signal RTREFCLK are assumed to rise. Here, a timing at which latching should be performed is timing T0 immediately before timing T1, and an expectation at this time is "4".

When the frequency-divided clock latch circuit 340 has performed latching at timing T0, a fractional part code VFRAC[3:0] representing "0" is output. In addition, when the integrated value latch circuit 320 has performed latching at timing T3, an integral part code VINT[3:0] representing "5" is output. The fractional part code VFRAC[0] is "0" and the integral part code VINT[0] is "1". Since VFRAC[0] and VINT[0] are not consistent with each other, the correction circuit 330 designates a correction value of "−1". Accordingly, a phase difference is corrected. When an integer, a decimal fraction and the correction value in state 3 are put into formula 1, the following formula is obtained.

$$Phe = 5-0-1 = 4 \ldots \quad \text{Formula 4}$$

According to formula 4, phase difference information PHE representing an expectation is also output in state 3 in which error is generated.

Figure 18:
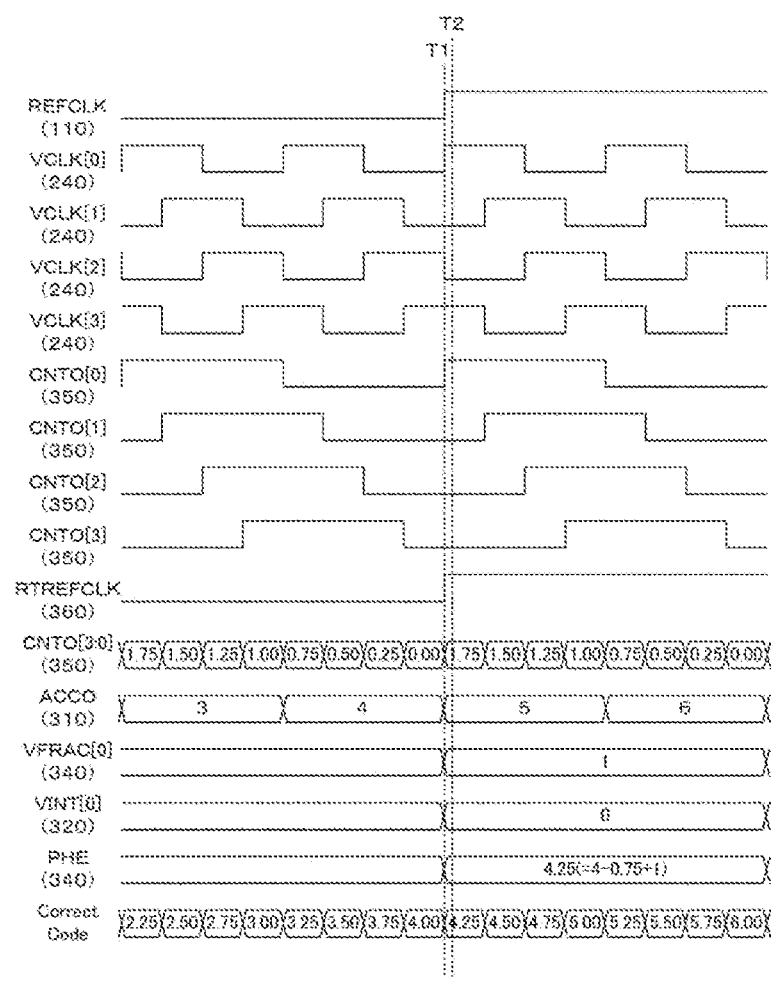
FIG. 18 is a timing chart illustrating an example of an operation of the phase locked loop in state 4 in the first embodiment of the present technology.

FIG. 18 is a timing chart illustrating an example of operation of the phase locked loop 200 in state 4 in the first embodiment of the present technology.

At timing T1, the reference clock signal REFCLK, the feedback clock signal VCLK[0], the frequency-divided clock signal CNTO[0], and the retiming clock signal RTREFCLK are assumed to rise. Here, a timing at which latching should be performed is timing T2 immediately after timing T1, and an expectation at this time is "4.25".

When the frequency-divided clock latch circuit 340 has performed latching at timing T2, a fractional part code VFRAC[3:0] representing "1.75" is output. In addition, when the integrated value latch circuit 320 has performed latching at timing T1, an integral part code VINT[3:0] representing "4" is output. The fractional part code VFRAC[0] is "1" and the integral part code VINT[0] is "0". Since VFRAC[0] and VINT[0] are not consistent with each other, the correction circuit 330 designates a correction value of "+1". Accordingly, a phase difference is corrected. When an integer, a decimal fraction and the correction value in state 4 are put into formula 1, the following formula is obtained.

$$Phe = 4 - 0.75 + 1 = 4.25 \ldots \quad \text{Formula 5}$$

According to formula 5, phase difference information PHE representing an expectation is also output in state 4 in which error is generated.

As exemplified in FIG. 15 to FIG. 18, even when error is generated in a phase difference because latching is performed according to the feedback clock signal VCLK[0] and the reference clock signal REFCLK which are not synchronized with each other, the correction circuit 330 can correct the error. Meanwhile, although the integrated value latch circuit 320 latches the integrated value code ACCO before the retiming signal RTREFCLK in FIG. 15 to FIG. 18, the present technology is not limited to this configuration. Since the retiming signal RTREFCLK and the integrated value code ACCO are in a synchronization relation, the integrated value code ACCO after the retiming signal RTREFCLK can also be latched. For example, the integrated value code ACCO after the retiming signal RTREFCLK is "6" in state 2 and state 3 in FIG. 16 and FIG. 17 and "5" in state 1 and state 4 in FIG. 15 and FIG. 18. When the integrated value code ACCO after the retiming signal RTREFCLK is latched, the phase comparator 220 may always set a calculation result of phase difference information PHE to "−1". As a method of determining the integrated value code ACCO before or after the retiming signal RTREFCLK, adjustment of delay time, or the like may be conceived. For example, if the retiming signal RTREFCLK is delayed with respect to the integrated value latch circuit 320 using a delay buffer or the like, the integrated value code ACCO thereafter is latched. On the other hand, if the integrated value code ACCO is delayed using a delay buffer or the like, the integrated value code ACCO before the retiming signal RTREFCLK is latched.

Figure 19:
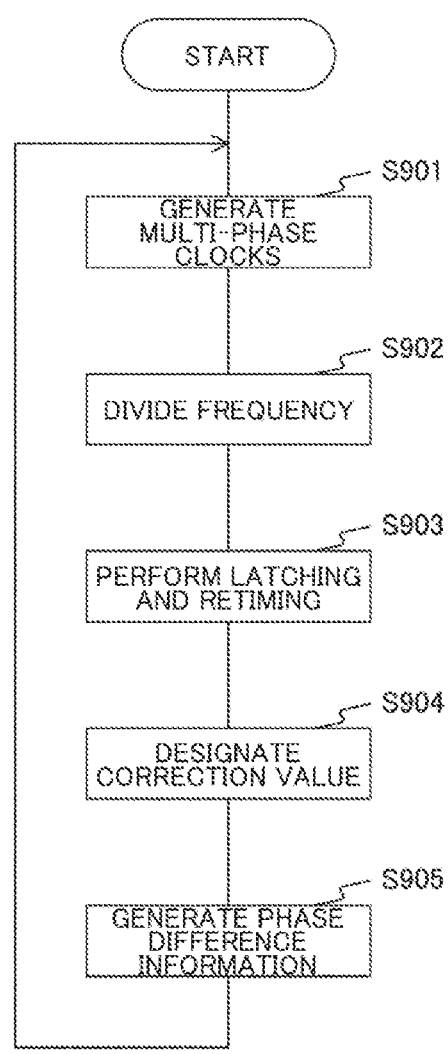
FIG. 19 is a flowchart illustrating an example of an operation of the phase locked loop in the first embodiment of the present technology.

FIG. 19 is a flowchart illustrating an example of operation of the phase locked loop 200 in the first embodiment of the present technology. This operation is started, for example, upon input of the reference clock signal REFCLK to the phase locked loop 200.

In the phase locked loop 200, the multi-phase clock generation circuit 240 generates multi-phase clock signals on the basis of phase difference information and outputs the multi-phase clock signals as feedback clock signals VCLK (step S901). The feedback side frequency divider 350 divides frequencies of the feedback clock signals VCLK (step S902). The frequency-divided clock latch circuit 340, the integrated value latch circuit 320, and the retiming circuit 360 perform latching and retiming (step S903). The correction circuit 330 designates a correction value (step S904). The phase comparator 220 generates phase difference information using the correction value or the like (step S905). After step S905, the phase locked loop 200 repeatedly executes step S901 and the following steps.

In this manner, the multi-phase clock generation circuit 240 generates feedback clock signals having different phases in the first embodiment of the present technology, and thus a TDC for converting a clock signal into multiple phases is not necessary. Accordingly, it is possible to reduce the circuit scale of a circuit for generating phase difference information as compared to a case in which conversion into multiple phases is performed using a TDC.

Modified Example

Although the digitally controlled oscillator 250 performs conversion into multiple phases using delay elements of a plurality of stages in the above-described first embodiment, the number of stages of delay elements increases as the number of phases increases to improve time resolution. When the number of stages of delay elements increases, circuit scale increases and a delay time varies according to a process, a temperature, or a power supply voltage, and thus it is difficult to perform design compensation. A phase locked loop 200 in a modified example of the first embodiment differs from the first embodiment in that conversion into multiple phases is performed using a frequency dividing circuit.

Figure 20:
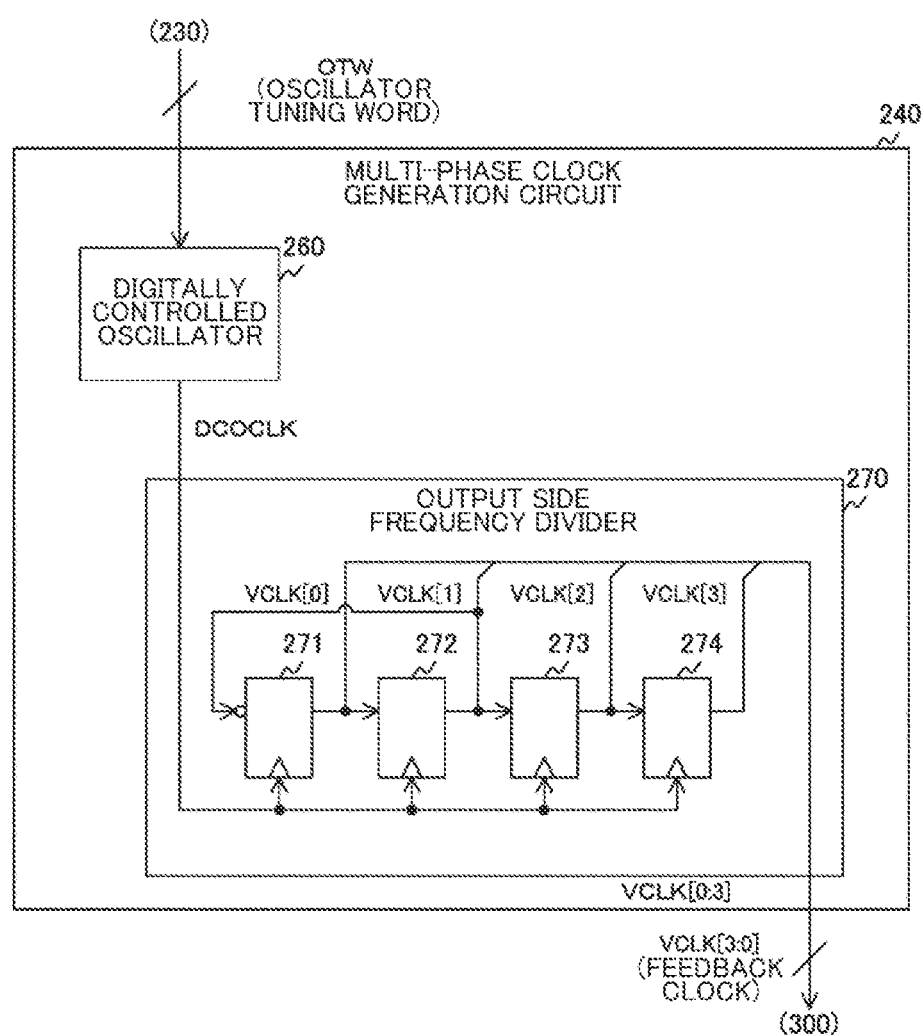
FIG. 20 is a circuit diagram illustrating a configuration example of a multi-phase clock generation circuit in a modified example of the first embodiment of the present technology.

FIG. 20 is a circuit diagram illustrating a configuration example of a multi-phase clock generation circuit 240 in a modified example of the first embodiment of the present technology. This multi-phase clock generation circuit 240 includes a digitally controlled oscillator 260 and an output side frequency divider 270.

The digitally controlled oscillator 260 generates an output clock signal DCOCLK according to an oscillator tuning word OTW and outputs the output clock signal DCOCLK to the output side frequency divider 270. A configuration of the digitally controlled oscillator 260 is the same as the digitally controlled oscillator 250 of the first embodiment except that only 1 phase is output.

The output side frequency divider 270 divides the frequency of the output clock signal DCOCLK to convert it into a plurality of feedback clock signals VCLK having multiple phases. This output side frequency divider 270 includes flip-flops 271 to 274.

The flip-flop 271 holds an inverted value of the output signal of the flip-flop 272 in synchronization with the output clock signal DCOCLK and outputs the held value to the flip-flop 272.

The flip-flop 272 holds the output signal of the flip-flop 271 in synchronization with the output clock signal DCOCLK and outputs the held value to the flip-flop 273. The flip-flop 273 holds the output signal of the flip-flop 272 in synchronization with the output clock signal DCOCLK and outputs the held value to the flip-flop 274.

The flip-flop 274 holds the output signal of the flip-flop 273 in synchronization with the output clock signal DCOCLK and outputs the held value to the flip-flop 271.

In addition, the output signals of the flip-flops 271 to 274 are supplied to the phase information acquisition circuit 300 as feedback clock signals VCLK[0] to VCLK[3].

As described above, according to the modified example of the first embodiment, it is possible to increase the number of phases without increasing the number of stages of delay elements in the digitally controlled oscillator 250 because the output side frequency divider 270 provided following the digitally controlled oscillator 260 performs conversion into multiple phases. Accordingly, it is possible to easily perform design compensation for variation in delay time of each delay element.

2. Second Embodiment

In the above-described first embodiment, a phase difference between the output signal of a flip-flop in a certain stage in the feedback side frequency divider 350 and the output signal of the flip-flop in the next stage is a ¼ period. In this configuration, however, a setup time of each flip-flop in the feedback side frequency divider 350 decreases as the frequencies of the feedback clock signals VCLK increase, and thus it is difficult to achieve fast operation. A feedback side frequency divider 350 of the second embodiment differs from the second embodiment in that a phase difference between the output signal of a flip-flop in a certain stage and the output signal of the flip-flop in the next stage is increased.

Figure 21:
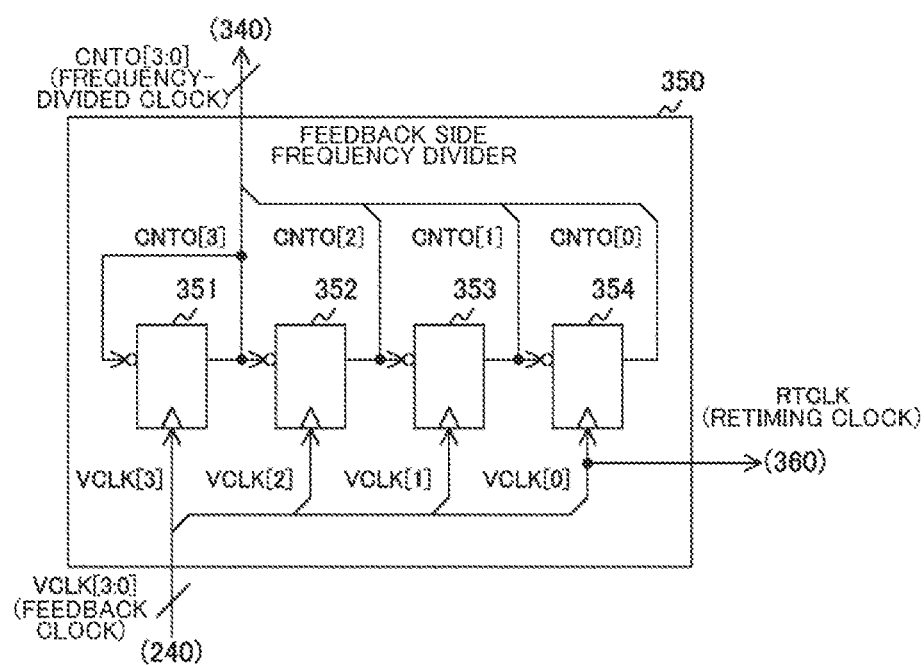
FIG. 21 is a circuit diagram illustrating a configuration example of a feedback side frequency divider in a second embodiment of the present technology.

FIG. 21 is a circuit diagram illustrating a configuration example of the feedback side frequency divider 350 in the second embodiment of the present technology. In the feedback side frequency divider 350 of the second embodiment, an inverted value of the output signal of a leading flip-flop 351 is input to this flip-flop 351. In addition, in the second and following stages, an inverted value of the output signal of a previous stage (flip-flop 351 or the like) is input to the next stage (flip-flop 352 or the like).

According to the aforementioned configuration, a phase difference between the output signal of a flip-flop in a certain stage and the output signal of the flip-flop in the next stage becomes a ¾ period which is greater than the ¼ period in the first embodiment. Accordingly, a margin is generated in the setup time as compared to the first embodiment, and thus it is possible to easily achieve fast operation.

Meanwhile, the modified example of the first embodiment can also be applied to the phase locked loop 200 of the second embodiment.

In this manner, a phase difference between the output signal of a flip-flop in a certain stage and the output signal of the flip-flop in the next stage is increased to a ¾ period in the feedback side frequency divider 350 in the second embodiment of the present technology, and thus it is possible to easily achieve fast operation as compared to a case in which the phase difference is a ¼ period.

3. Third Embodiment

Although the phase locked loop 200 generates 4-phase feedback clock signals VCLK in the above-described first embodiment, the number of phases of the feedback clock signals VCLK is not limited to 4. A phase locked loop 200 of the third embodiment differs from the first embodiment in that it generates 2-phase feedback clock signals VCLK.

Figure 22:
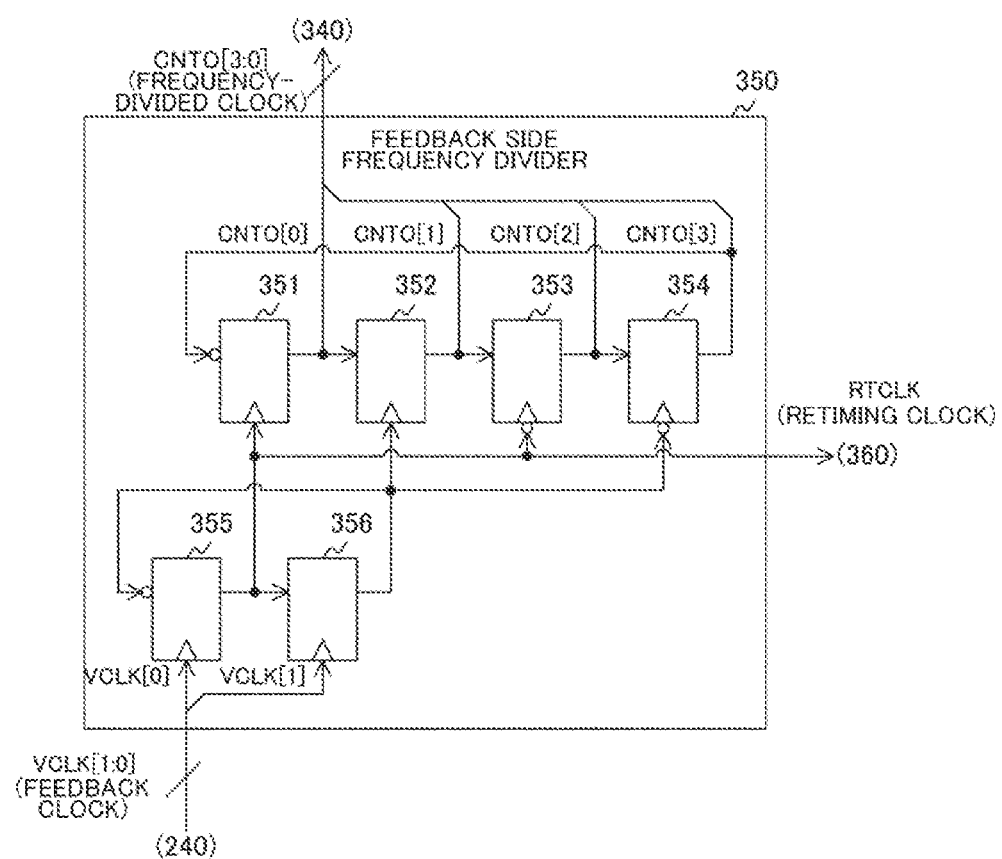
FIG. 22 is a circuit diagram illustrating a configuration example of a feedback side frequency divider in a third embodiment of the present technology.

FIG. 22 is a circuit diagram illustrating a configuration example of a feedback side frequency divider 350 in the third embodiment of the present technology. A multi-phase clock generation circuit 240 of the third embodiment differs from the first embodiment in that it generates 2-phase feedback clock signals VCLK. In addition, the feedback side frequency divider 350 of the third embodiment differs from the first embodiment in that it further includes flip-flops 355 and 356.

The flip-flop 355 holds the output signal of the flip-flop 356 in synchronization with the feedback clock signal VCLK[0] and outputs the held value to the flip-flop 356. The flip-flop 356 holds the output signal of the flip-flop 355 in synchronization with the feedback clock signal VCLK[1] and outputs the held value to the flip-flop 355.

In addition, the flip-flop 351 of the third embodiment holds an inverted value of the output signal of the flip-flop 354 in synchronization with the output signal of the flip-flop 355 and outputs the held value to the flip-flop 352. The flip-flop 352 holds the output signal of the flip-flop 351 in synchronization with the output signal of the flip-flop 356 and outputs the held value to the flip-flop 353. The flip-flop 353 holds the output signal of the flip-flop 352 in synchronization with an inverted value of the output signal of the flip-flop 355 and outputs the held value to the flip-flop 354. The flip-flop 354 holds the output signal of the flip-flop 353 in synchronization with an inverted value of the output signal of the flip-flop 356 and outputs the held value to the flip-flop 351.

According to the aforementioned configuration, the feedback side frequency divider 350 generates 4-phase frequency-divided clock signals CNTO[3:0] from 2-phase feedback clock signals VCLK[1:0]. The number of stages of delay elements in the multi-phase clock generation circuit 240 can be reduced by generating the 2-phase feedback clock signals VCLK.

Meanwhile, the modified example of the first embodiment can also be applied to the phase locked loop 200 of the third embodiment.

In this manner, according to the third embodiment of the present technology, it is possible to reduce the number of stages of delay elements in the multi-phase clock generation circuit 240 because the feedback side frequency divider 350 generates 4-phase frequency-divided clock signals CNTO from 2-phase feedback clock signals VCLK.

4. Fourth Embodiment

Although the phase locked loop 200 generates 4-phase feedback clock signals VCLK in the above-described first embodiment, the number of phases of the feedback clock signals VCLK is not limited to 4. A phase locked loop 200 of the fourth embodiment differs from the first embodiment in that it generates 3-phase feedback clock signals VCLK.

Figure 23:
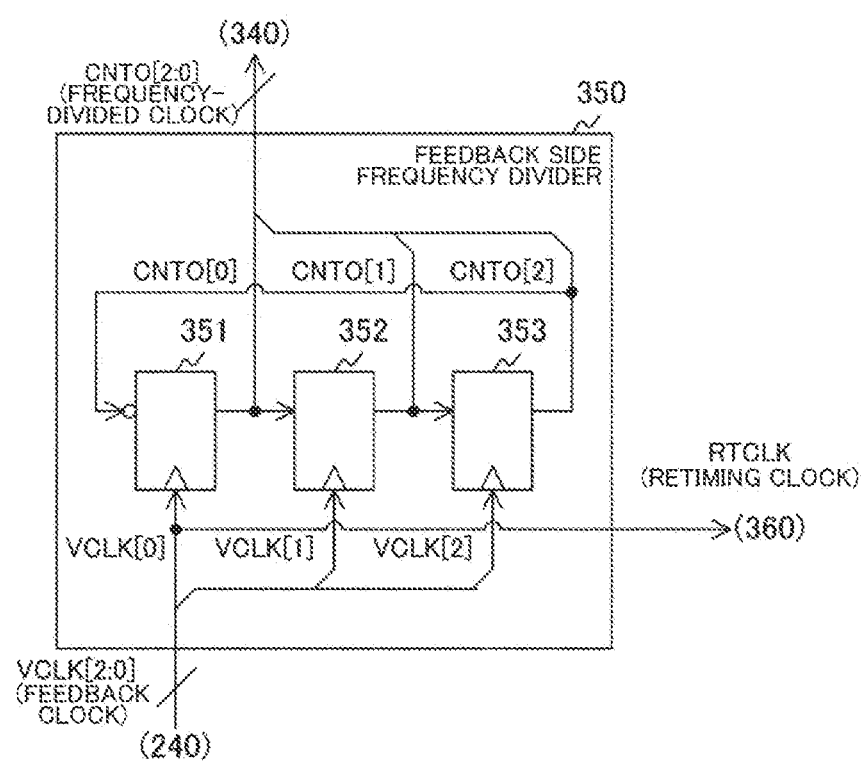
FIG. 23 is a circuit diagram illustrating a configuration example of a feedback side frequency divider in a fourth embodiment of the present technology.

FIG. 23 is a circuit diagram illustrating a configuration example of a feedback side frequency divider 350 in the fourth embodiment of the present technology. A multi-phase clock generation circuit 240 of the fourth embodiment differs from the first embodiment in that it generates 3-phase feedback clock signals VCLK. In addition, the feedback side frequency divider 350 of the fourth embodiment differs from the first embodiment in that it does not include the flip-flop 354.

An inverted value of the output signal of the flip-flop 353 of the fourth embodiment is input to the flip-flop 351. According to this configuration, the feedback side frequency divider 350 generates 3-phase frequency-divided clock signals CNTO[2:0] from 3-phase feedback clock signals VCLK [2:0]. The number of stages of delay elements in the multi-phase clock generation circuit 240 can be reduced by generating the 3-phase feedback clock signals VCLK.

Meanwhile, the modified example of the first embodiment can also be applied to the phase locked loop 200 of the fourth embodiment.

In this manner, according to the fourth embodiment of the present technology, it is possible to reduce the number of stages of delay elements in the multi-phase clock generation circuit 240 because the feedback side frequency divider 350 generates 3-phase frequency-divided clock signals CNTO from 3-phase feedback clock signals VCLK.

5. Fifth Embodiment

Although the phase locked loop 200 generates 4-phase feedback clock signals VCLK in the above-described first embodiment, the number of phases of the feedback clock signals VCLK is not limited to 4. A phase locked loop 200 of the fifth embodiment differs from the first embodiment in that it generates 3-phase feedback clock signals VCLK.

Figure 24:
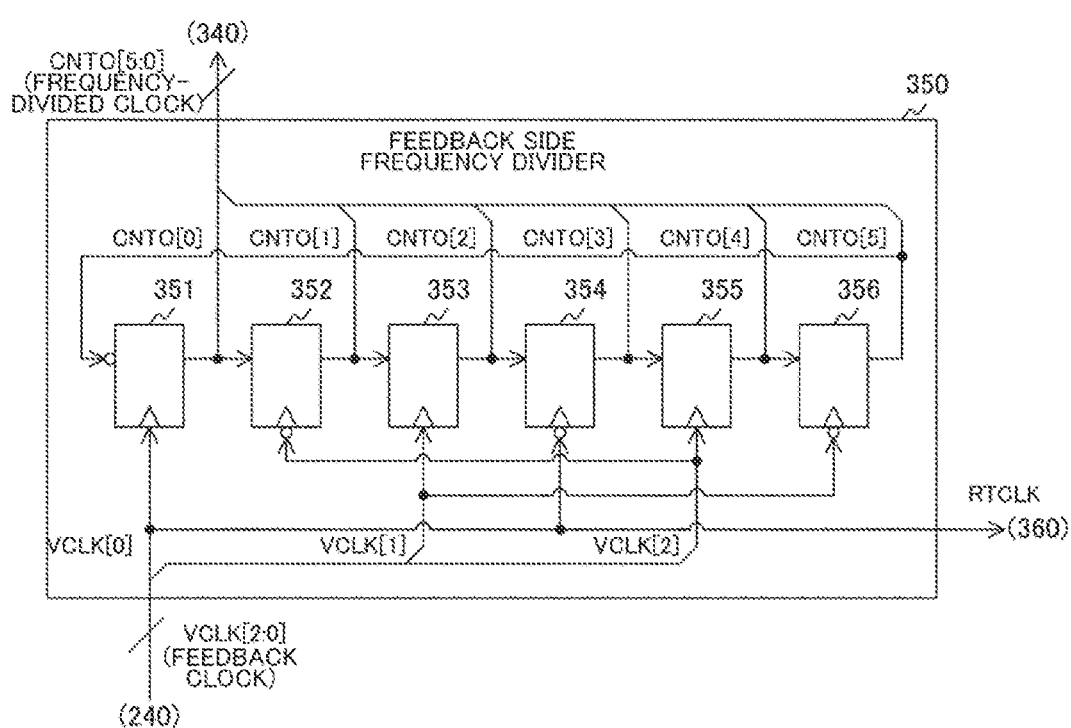
FIG. 24 is a circuit diagram illustrating a configuration example of a feedback side frequency divider in a fifth embodiment of the present technology.

FIG. 24 is a circuit diagram illustrating a configuration example of a feedback side frequency divider 350 in the fifth embodiment of the present technology. A multi-phase clock generation circuit 240 of the fifth embodiment differs from the first embodiment in that it generates 3-phase feedback clock signals VCLK. In addition, the feedback side frequency divider 350 of the fifth embodiment differs from the first embodiment in that it further includes flip-flops 355 and 356.

In the fifth embodiment, the flip-flop 351 holds an inverted value of the output signal of the flip-flop 356 in synchronization with the feedback clock signal VCLK[0] and outputs the held value to the flip-flop 352. The flip-flop 352 holds the output signal of the flip-flop 351 in synchronization with an inverted value of the feedback clock signal VCLK[2] and outputs the held value to the flip-flop 353. The flip-flop 353 holds the output signal of the flip-flop 352 in synchronization with the feedback clock signal VCLK[1] and outputs the held value to the flip-flop 354.

The flip-flop 354 holds the output signal of the flip-flop 353 in synchronization with an inverted value of the feedback clock signal VCLK[0] and outputs the held value to the flip-flop 355. The flip-flop 355 holds the output signal of the flip-flop 354 in synchronization with the feedback clock signal VCLK[2] and outputs the held value to the flip-flop 356. The flip-flop 356 holds the output signal of the flip-flop 355 in synchronization with an inverted value of the feedback clock signal VCLK[1] and outputs the held value to the flip-flop 351. In addition, the output signals of the flip-flops 351 to 356 are output as frequency-divided clock signals CNTO[0] to CNTO[5].

According to the aforementioned configuration, the feedback side frequency divider 350 generates 6-phase frequency-divided clock signals CNTO[5:0] from 3-phase feedback clock signals VCLK[2:0]. The number of stages of delay elements in the multi-phase clock generation circuit 240 can be reduced by generating the 3-phase feedback clock signals VCLK.

Meanwhile, the modified example of the first embodiment can also be applied to the phase locked loop 200 of the fifth embodiment.

In this manner, according to the fifth embodiment of the present technology, it is possible to reduce the number of stages of delay elements in the multi-phase clock generation circuit 240 because the feedback side frequency divider 350 generates 6-phase frequency-divided clock signals CNTO from 3-phase feedback clock signals VCLK. Further, it is possible to increase the number of phases of frequency-divided clock signals and improve phase resolution.

Meanwhile, the above-described embodiments show examples for embodying the present technology, and matters in the embodiments and matters specifying the invention in the claims have a corresponding relationship with each other. Similarly, the matters specifying the invention in the claims and the matters in the embodiments of the present technique having the same name have a corresponding relationship with each other. However, the present technique is not limited to the embodiments and can be embodied by applying various modifications to the embodiments without departing from the gist thereof.

In addition, the processing procedures in the above-described embodiments may be ascertained as methods including the series of procedures or may be ascertained as a program that causes a computer to perform the series of procedures and a recording medium that stores the program. As the recording medium, for example, a compact disc (CD), a MiniDisc (MD), a digital versatile disc (DVD), a memory card, a Blu-ray (registered trademark) disc, or the like can be used.

In addition, the effects described in the present specification are merely examples and are not intended as limiting, and other effects may be obtained.

Further, the present technology can also have the following configurations.

(1) A phase locked loop including a multi-phase clock generation circuit configured to generate a plurality of feedback clock signals having different phases, a feedback side frequency divider configured to divide frequencies of the plurality of feedback clock signals and to output the feedback clock signals as frequency-divided clock signals, a reference clock latch circuit configured to hold the frequency-divided clock signals in synchronization with a predetermined reference clock signal and to output a held value, and a control circuit configured to control the frequencies of the plurality of feedback clock signals on the basis of the held value.

(2) The phase locked loop according to (1), wherein the reference clock latch circuit outputs the held value as a fractional part code representing a fractional part of a phase difference between the reference clock signal and any of the plurality of feedback clock signals, and the control circuit includes a feedback side accumulator configured to integrate a predetermined value in synchronization with any of the frequency-divided clock signals and to output an integrated value, a retiming circuit configured to hold the reference clock signal in synchronization with any of the plurality of feedback clock signals and to output the reference clock signal as a retiming clock signal, an integrated value latch circuit configured to hold the integrated value in synchronization with the retiming clock signal and to output the held value as an integral part code representing an integral part of the phase difference, a correction circuit configured to obtain a correction value for the phase difference representing the integral part code and the fractional part code, and a phase comparator configured to correct the phase difference according to the correction value and to output phase difference information representing the corrected phase difference.

(3) The phase locked loop according to (1) or (2), wherein the multi-phase clock generation circuit is a digitally controlled oscillator configured to generate the plurality of feedback clock signals.

(4) The phase locked loop according to (1) or (2), wherein the multi-phase clock generation circuit includes
a digitally controlled oscillator configured to generate a predetermined output clock signal, and
an output side frequency divider configured to divide a frequency of the output clock signal to convert the output clock signal into the plurality of feedback clock signals having multiple phases.

(5) The phase locked loop according to any one of (1) to (4), wherein the feedback side frequency divider is a counter.

(6) The phase locked loop according to (5), wherein the counter includes multi-stage flip-flops, and
wherein an inverted signal of an output of a last one of the multi-stage flip-flops is input to a leading one of the multi-stage flip-flops.

(7) The phase locked loop according to (5), wherein the multi-phase clock generation circuit generates two feedback clock signals, and the feedback side frequency divider generates four frequency-divided clock signals.

(8) The phase locked loop according to (5), wherein the multi-phase clock generation circuit generates three feedback clock signals, and the feedback side frequency divider generates three frequency-divided clock signals.

(9) The phase locked loop according to (5), wherein the multi-phase clock generation circuit generates three feedback clock signals, and the feedback side frequency divider generates six frequency-divided clock signals.

(10) The phase locked loop according to (5), wherein the counter includes multi-stage flip-flops, and
wherein an inverted value of an output signal of a leading one of the multi-stage flip-flops is input to the leading one.

(11) The phase locked loop according to (10), wherein an output signal of a previous stage is input to the following stage in the multi-stage flip-flops.

(12) The phase locked loop according to (10), wherein an inverted value of an output signal of a previous stage is input to the following stage in the multi-stage flip-flops.

(13) An electronic device including a multi-phase clock generation circuit configured to generate a plurality of feedback clock signals having different phases, a feedback side frequency divider configured to divide frequencies of the plurality of feedback clock signals and to output the feedback clock signals as frequency-divided clock signals,
a reference clock latch circuit configured to hold the frequency-divided clock signals in synchronization with a predetermined reference clock signal and to output a held value,
a control circuit configured to control the frequencies of the plurality of feedback clock signals on the basis of the held value, and
a processing circuit configured to perform predetermined processing in synchronization with any of the plurality of feedback clock signals.

(14) A method for controlling a phase locked loop, including a multi-phase clock generation procedure for generating a plurality of feedback clock signals having different phases,
a feedback side frequency dividing procedure for dividing frequencies of the plurality of feedback clock signals and outputting the feedback clock signals as frequency-divided clock signals,
a reference clock latching procedure for holding the frequency-divided clock signals in synchronization with a predetermined reference clock signal and outputting a held value, and
a control procedure for controlling the frequencies of the plurality of feedback clock signals on the basis of the held value.

REFERENCE SIGNS LIST

100 Electronic device
110 Crystal resonator
120 Register
130 Processing circuit
200 Phase locked loop
210 Reference side accumulator
211, 221, 222, 311 Adder
212, 312 Latch circuit
220 Phase comparator
223, 225 Switch
224 Complement calculator
230 Digital filter
240 Multi-phase clock generation circuit
250, 260 Digitally controlled oscillator
251, 253, 254, 255 Buffer
252 Inverter
256 Selector
270 Output side frequency divider
271, 272, 273, 274, 341, 342, 343, 344, 351, 352, 353, 354, 355, 356 Flip-flop
300 Phase information acquisition circuit
310 Feedback side accumulator
320 Integrated value latch circuit
330 Correction circuit
331, 332 XOR (exclusive OR) gate
340 Frequency-divided clock latch circuit
350 Feedback side frequency divider
360 Retiming circuit
400 Control circuit

The invention claimed is:
1. A phase locked loop comprising:
a multi-phase clock generation circuit configured to generate a plurality of feedback clocks signals having different phases;
a feedback side frequency divider configured to divide frequencies of the plurality of feedback clock signals and to output the plurality of feedback clock signals as frequency-divided clock signals;
a reference clock latch circuit configured to:
hold the frequency divided clock signals in synchronization with a predetermined reference clock signal and to output a held value, and output the held value as a fractional part code representing a fractional part of a phase difference between the reference clock signal and any of the plurality of feedback clock signals; and a control circuit configured to control the frequencies of the plurality of feedback clock signals based on the held value, wherein the control circuit includes:

a feedback side accumulator configured to integrate a predetermined value in synchronization with any of the frequency-divided clock signals and to output an integrated value, a retiming circuit configured to hold the reference clock signal in synchronization with any of the plurality of feedback clock signals and to output the reference clock signal as a retiming clock signal, an integrated value latch circuit configured to hold the integrated value in synchronization with the retiming clock signal and to output the held value as an integral part code representing an integral part of the phase difference, a correction circuit configured to obtain a correction value for the phase difference representing the integral part code and the fractional part code, and a phase comparator configured to correct the phase difference according to the correction value and to output phase difference information representing the corrected phase difference.

2. The phase locked loop according to claim 1, wherein the multi-phase clock generation circuit is a digitally controlled oscillator configured to generate the plurality of feedback clock signals.

3. The phase locked loop according to claim 1, wherein the multi-phase clock generation circuit includes:

a digitally controlled oscillator configured to generate a predetermined output clock signal; and an output side frequency divider configured to divide a frequency of the output clock signal to convert the output clock signal into the plurality of feedback clock signals having multiple phases.

4. The phase locked loop according to claim 1, wherein the feedback side frequency divider is a counter.

5. The phase locked loop according to claim 4, wherein the counter includes multi-stage flip-flops, and wherein an inverted signal of an output of a last one of the multi-stage flip-flops is input to a leading one of the multi-stage flip-flops.

6. The phase locked loop according to claim 4, wherein the multi-phase clock generation circuit generates two feedback clock signals, and the feedback side frequency divider generates four frequency-divided clock signals.

7. The phase locked loop according to claim 4, wherein the multi-phase clock generation circuit generates three feedback clock signals, and the feedback side frequency divider generates three frequency-divided clock signals.

8. The phase locked loop according to claim 4, wherein the multi-phase clock generation circuit generates three feedback clock signals, and the feedback side frequency divider generates six frequency-divided clock signals.

9. The phase locked loop according to claim 4, wherein the counter includes multistage flip-flops, and wherein an inverted value of an output signal of a leading one of the multi-stage flip-flops is input to the leading one.

10. The phase locked loop according to claim 9, wherein an output signal of a previous stage is input to the following stage in the multi-stage flip-flops.

11. The phase locked loop according to claim 9, wherein an inverted value of an output signal of a previous stage is input to the following stage in the multi-stage flip-flops.

12. An electronic device comprising:

a multi-phase clock generation circuit configured to generate a plurality of feedback clock signals having different phases;

a feedback side frequency divider configured to divide frequencies of the plurality of feedback clock signals and to output the plurality of the feedback clock signals as frequency-divided clock signals;

a reference clock latch circuit configured to:

hold the frequency divided clock signals in synchronization with a predetermined reference clock signal and to output a held value, and output the held value as a fractional part code representing a fractional part of a phase difference between the reference clock signal and any of the plurality of feedback clock signals;

a control circuit configured to control the frequencies of the plurality of feedback clock signals based on the held value, wherein the control circuit includes:

a feedback side accumulator configured to integrate a predetermined value in synchronization with any of the frequency-divided clock signals and to output an integrated value, a retiming circuit configured to hold the reference clock signal in synchronization with any of the plurality of feedback clock signals and to output the reference clock signal as a retiming clock signal, an integrated value latch circuit configured to hold the integrated value in synchronization with the retiming clock signal and to output the held value as an integral part code representing an integral part of the phase difference, a correction circuit configured to obtain a correction value for the phase difference representing the integral part code and the fractional part code, and a phase comparator configured to correct the phase difference according to the correction value and to output phase difference information representing the corrected phase difference; and a processing circuit configured to perform predetermined processing in synchronization with any of the plurality of feedback clock signals.

13. A method for controlling a phase locked loop, comprising:

a multi-phase clock generation procedure for generating a plurality of feedback clock signals having different phases;

a feedback side frequency dividing procedure for dividing frequencies of the plurality of feedback clock signals and outputting the plurality of feedback clock signals as frequency-divided clock signals;

a reference clock latching procedure comprising:

holding the frequency-divided clock signals in synchronization with a predetermined reference clock signal and outputting a held value, and outputting the held value as a fractional part code representing a fractional part of a phase difference between the reference clock signal and any of the plurality of feedback clock signals; and a control procedure for controlling the frequencies of the plurality of feedback clock signals based on the held value, wherein the control procedure includes:
- integrating a predetermined value in synchronization with any of the frequency-divided clock signals and to output an integrated value,
- holding the reference clock signal in synchronization with any of the plurality of feedback clock signals and to output the reference clock signal as a retiming clock signal,
- holding the integrated value in synchronization with the retiming clock signal and to output the held value as an integral part code representing an integral part of the phase difference,
- obtaining a correction value for the phase difference representing the integral part code and the fractional part code, and
- correcting the phase difference according to the correction value and to output phase difference information representing the corrected phase difference.

* * * * *